(12) United States Patent
Wang et al.

(10) Patent No.: US 12,216,365 B2
(45) Date of Patent: Feb. 4, 2025

(54) ARRAY SUBSTRATE AND METHOD FOR MANUFACTURING THE SAME, AND DISPLAY APPARATUS

(71) Applicant: BOE TECHNOLOGY GROUP CO., LTD., Beijing (CN)

(72) Inventors: Jiguo Wang, Beijing (CN); Jian Sun, Beijing (CN); Jiantao Liu, Beijing (CN); Xiaoyan Yang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 189 days.

(21) Appl. No.: 17/797,983

(22) PCT Filed: Sep. 8, 2021

(86) PCT No.: PCT/CN2021/117269
§ 371 (c)(1),
(2) Date: Aug. 5, 2022

(87) PCT Pub. No.: WO2022/089025
PCT Pub. Date: May 5, 2022

(65) Prior Publication Data
US 2023/0041917 A1    Feb. 9, 2023

(30) Foreign Application Priority Data
Oct. 30, 2020    (CN) .......................... 202011195950.6

(51) Int. Cl.
*G02F 1/1343* (2006.01)
*G02F 1/1335* (2006.01)
(Continued)

(52) U.S. Cl.
CPC .. *G02F 1/134345* (2021.01); *G02F 1/133512* (2013.01); *G02F 1/133553* (2013.01);
(Continued)

(58) Field of Classification Search
CPC ......... G02F 1/134345; G02F 1/136295; G02F 1/133512; G02F 1/133553; G02F 1/1339;
(Continued)

(56) References Cited

U.S. PATENT DOCUMENTS 7,903,216 B2 * 3/2011 Tsuchiya ............... G02F 1/1393
349/114
2006/0192906 A1    8/2006 Ryu et al.
(Continued)

FOREIGN PATENT DOCUMENTS

CN    101221333 A    7/2008
CN    102162960 A    8/2011
(Continued)

*Primary Examiner* — Dung T Nguyen
*Assistant Examiner* — David Y Chung
(74) *Attorney, Agent, or Firm* — IP & T GROUP LLP

(57) ABSTRACT

An array substrate includes: a first substrate; a plurality of gate lines and a plurality of data lines; a plurality of thin film transistors; and a plurality of reflective electrodes. The plurality of gate lines and the plurality of data lines define a plurality of sub-pixel regions. A thin film transistor is located in a sub-pixel region. A reflective electrode is located in the sub-pixel region and electrically connected to the thin film transistor in the same sub-pixel region. Each reflective electrode has a border including a plurality of first sub-borders extending in a first direction, a plurality of second sub-borders extending in a second direction, and a plurality of chamfer borders each connecting a first sub-border and a second sub-border that are adjacent; and an intersection of extension lines of the first sub-border and the second sub-border is located outside the border of the reflective electrode.

15 Claims, 13 Drawing Sheets

(51) Int. Cl.
*G02F 1/1339* (2006.01)
*G02F 1/1362* (2006.01)
*G02F 1/1368* (2006.01)
*H01L 27/12* (2006.01)

(52) U.S. Cl.
CPC ........ *G02F 1/1339* (2013.01); *G02F 1/13439* (2013.01); *G02F 1/136295* (2021.01); *G02F 1/1368* (2013.01); *H01L 27/1244* (2013.01); *H01L 27/1255* (2013.01); *H01L 27/1288* (2013.01)

(58) Field of Classification Search
CPC ............... G02F 1/13439; G02F 1/1368; H01L 27/1244; H01L 27/1255; H01L 27/1288
USPC .......................... 349/113, 114, 146, 155, 156
See application file for complete search history.

(56) References Cited

U.S. PATENT DOCUMENTS

| | | | |
|---|---|---|---|
| 2007/0195239 A1* | 8/2007 | Lee | G02F 1/136227 349/114 |
| 2008/0121893 A1* | 5/2008 | Kim | G02F 1/134336 257/E27.111 |
| 2016/0091753 A1* | 3/2016 | Shim | G02F 1/133514 349/108 |
| 2016/0380005 A1 | 12/2016 | Hou et al. | |
| 2020/0075703 A1 | 3/2020 | Lee | |
| 2020/0159057 A1* | 5/2020 | Park | G02F 1/13394 |

FOREIGN PATENT DOCUMENTS

| | | |
|---|---|---|
| CN | 202796955 U | 3/2013 |
| CN | 103034004 A | 4/2013 |
| CN | 104952887 A | 9/2015 |

\* cited by examiner

ARRAY SUBSTRATE AND METHOD FOR MANUFACTURING THE SAME, AND DISPLAY APPARATUS

CROSS-REFERENCE TO RELATED APPLICATIONS

This application is a national phase entry under 35 USC 371 of International Patent Application No. PCT/CN2021/117269, filed on Sep. 8, 2021, which claims priority to Chinese Patent Application No. 202011195950.6, filed on Oct. 30, 2020, which are incorporated herein by reference in their entirety.

TECHNICAL FIELD

The present disclosure relates to the field of display technologies, and in particular, to an array substrate and a method for manufacturing the same, and a display apparatus.

BACKGROUND

Liquid crystal displays (LCDs) have been rapidly developed and widely used due to their characteristics of small size, low power consumption, non-radiation and the like.

SUMMARY

In an aspect, an array substrate is provided. The array substrate includes: a first substrate; a plurality of gate lines disposed on the first substrate and extending in a first direction, and a plurality of data lines disposed on the first substrate and extending in a second direction; a plurality of thin film transistors disposed on the first substrate; and a plurality of reflective electrodes disposed on a side of the plurality of thin film transistors away from the first substrate. The first direction intersects the second direction, and the plurality of gate lines and the plurality of data lines define a plurality of sub-pixel regions. A thin film transistor is located in a sub-pixel region. A reflective electrode is located in the sub-pixel region, and the reflective electrode is electrically connected to the thin film transistor located in the same sub-pixel region. Each reflective electrode has a border including: a plurality of first sub-borders extending in the first direction, a plurality of second sub-borders extending in the second direction, and a plurality of chamfer borders each connecting a first sub-border and a second sub-border that are adjacent. An intersection of extension lines of the first sub-border and the second sub-border that are adjacent is located outside the border of the reflective electrode.

In some embodiments, shapes of a plurality of chamfer borders of a same reflective electrode are substantially same; and/or, lengths of the plurality of chamfer borders of the same reflective electrode are substantially equal.

In some embodiments, shapes of chamfer borders of different reflective electrodes are substantially same; and/or, lengths of the chamfer borders of the different reflective electrodes are substantially equal.

In some embodiments, the shapes of the plurality of chamfer borders each include a straight-line shape. An included angle between a straight-line-shaped chamfer border and a first sub-border connected thereto is an obtuse angle, and an included angle between the straight-line-shaped chamfer border and a second sub-border connected thereto is an obtuse angle. Alternatively, the shapes of the plurality of chamfer borders each include a curved shape, and a center of curvature of a curved-shaped chamfer border is located within the border of the reflective electrode. Alternatively, the shapes of the plurality of chamfer borders each include a broken-line shape, and a broken-line-shaped chamfer border includes at least two line segments sequentially connected, and an included angle between two adjacent line segments is an obtuse angle.

In some embodiments, an included angle between a connecting direction of two end points of one of at least two chamfer borders and the first direction is substantially equal to an included angle between a connecting direction of two end points of another of the at least two chamfer borders and the first direction.

In some embodiments, the first direction and the second direction are substantially perpendicular to each other. An included angle between a connecting direction of two end points of each of the at least two chamfer borders and the first direction is 45°, and an included angle between the connecting direction of the two end points of each of the at least two chamfer borders and the second direction is 45°.

In some embodiments, the plurality of first sub-borders include two first sub-borders disposed oppositely; the plurality of second sub-borders include two second sub-borders disposed oppositely; the plurality of chamfer borders include four chamfer borders, and a chamfer border is connected between a first sub-border and a second sub-border that are adjacent.

In some embodiments, the array substrate further includes: a plurality of first electrodes with a same material and disposed in a same layer as the plurality of gate lines, and a plurality of second electrodes with a same material and disposed in a same layer as the plurality of data lines. A first electrode is located in the sub-pixel region, and a second electrode is located in the sub-pixel region. The first electrode and the second electrode located in the same sub-pixel region constitute a storage capacitor.

In some embodiments, each thin film transistor includes a source and a drain. In a case where the reflective electrode is electrically connected to a source of the thin film transistor located in the same sub-pixel region as the reflective electrode, a second electrode is electrically connected to and forms a one-piece structure with the source of the thin film transistor located in the same sub-pixel region as the reflective electrode. In a case where the reflective electrode is electrically connected to a drain of the thin film transistor located in the same sub-pixel region as the reflective electrode, the second electrode is electrically connected to and forms a one-piece structure with the drain of the thin film transistor located in the same sub-pixel region as the second electrode.

In some embodiments, in the same sub-pixel region, an orthogonal projection of a portion of the second electrode on the first substrate is located within an orthogonal projection of the first electrode on the first substrate.

In some embodiments, a minimum spacing between a border of the orthogonal projection of the second electrode on the first substrate and a border of the orthogonal projection of the first electrode on the first substrate is greater than or equal to 1 µm, and less than or equal to 10% of a spacing between two adjacent data lines.

In some embodiments, a minimum spacing between a border of an orthogonal projection of the second electrode on the first substrate and a border of an orthogonal projection of a data line adjacent to the second electrode on the first substrate is a first preset value, and the first preset value is greater than or equal to 3 µm, and less than or equal to 40% of a spacing between two adjacent data lines. Each thin film transistor includes a source and a drain. In a case where the second electrode is electrically connected to a source of the thin film transistor located in the same sub-pixel region as the second electrode, a spacing, in the first direction X, between the border of the orthogonal projection of the second electrode on the first substrate and a border of an orthogonal projection of a drain of the thin film transistor located in the same sub-pixel region as the second electrode on the first substrate is a second preset value, and the second preset value is greater than or equal to the first preset value. In a case where the second electrode is electrically connected to the drain of the thin film transistor located in the same sub-pixel region as the second electrode, a spacing, in the first direction X, between the border of the orthogonal projection of the second electrode on the first substrate and a border of an orthogonal projection of the source of the thin film transistor located in the same sub-pixel region as the second electrode on the first substrate is a third preset value, and the third preset value is greater than or equal to the first preset value.

In some embodiments, a minimum spacing between a border of an orthogonal projection of the first electrode on the first substrate and a border of an orthogonal projection of a data line adjacent to the first electrode on the first substrate is a fourth preset value. Each thin film transistor includes a source and a drain. In a case where the second electrode is electrically connected to a source of the thin film transistor located in the same sub-pixel region as the second electrode, a maximum spacing, in the first direction, between the border of the orthogonal projection of the first electrode located in the same sub-pixel region as the second electrode on the first substrate and a border of an orthogonal projection of a drain of the thin film transistor located in the same sub-pixel region as the second electrode on the first substrate is a fifth preset value, and the fifth preset value is greater than or equal to the fourth preset value. In a case where the second electrode is electrically connected to the drain of the thin film transistor located in the same sub-pixel region as the second electrode, a maximum spacing, in the first direction, between the border of the orthogonal projection of the first electrode located in the same sub-pixel region as the second electrode on the first substrate and a border of an orthogonal projection of the source of the thin film transistor located in the same sub-pixel region as the second electrode on the first substrate is a sixth preset value, and the sixth preset value is greater than or equal to the fourth preset value.

In another aspect, a display apparatus is provided. The display apparatus includes: the array substrate as described in any of the above embodiments, an opposite substrate disposed opposite to the array substrate, and a plurality of spacers disposed on a side of the opposite substrate proximate to the array substrate. An end surface of a spacer proximate to the array substrate corresponds to an overlapping position of a gate line and a data line in the array substrate, and is located in a region surrounded by chamfer borders of reflective electrodes adjacent to the overlapping position in the array substrate.

In some embodiments, a spacing between the end surface of the spacer proximate to the array substrate and each of the chamfer borders of the reflective electrodes adjacent to the spacer is greater than or equal to 2.5 µm.

In some embodiments, the opposite substrate includes a second substrate, and a black matrix disposed on a side of the second substrate proximate to the array substrate. The black matrix has a plurality of openings. An orthogonal projection of an opening on the first substrate in the array substrate is located within an orthogonal projection of a reflective electrode on the first substrate. A spacing between a border of a portion of the black matrix covering the overlapping position in the array substrate and a chamfer border of the reflective electrode is less than or equal to 2.5 µm.

In yet another aspect, a method for manufacturing an array substrate is provided. The method for manufacturing the array substrate includes: providing a first substrate; forming a plurality of gate lines extending in a first direction, a plurality of data lines extending in a second direction and a plurality of thin film transistors on a side of the first substrate, the first direction intersecting the second direction; the plurality of gate lines and the plurality of data lines defining a plurality of sub-pixel regions, and a thin film transistor being located in a sub-pixel region; and forming a plurality of reflective electrodes on a side of the plurality of thin film transistors away from the first substrate, a reflective electrode being located in the sub-pixel region, and the reflective electrode being electrically connected to the thin film transistor located in the same sub-pixel region. Each reflective electrode has a border including: a plurality of first sub-borders extending in the first direction, a plurality of second sub-borders extending in the second direction, and a plurality of chamfer borders each connecting a first sub-border and a second sub-border that are adjacent. An intersection of extension lines of the first sub-border and the second sub-border that are adjacent is located outside the border of the reflective electrode.

In some embodiments, the method for manufacturing the array substrate further includes: forming a plurality of first electrodes synchronously in a process of forming the plurality of gate lines, a first electrode being located in the sub-pixel region; and forming a plurality of second electrodes synchronously in a process of forming the plurality of data lines, a second electrode being located in the sub-pixel region. The first electrode and the second electrode that are located in the same sub-pixel region constitute a storage capacitor.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product and an actual process of a method involved in the embodiments of the present disclosure.

DETAILED DESCRIPTION

Figure 1:
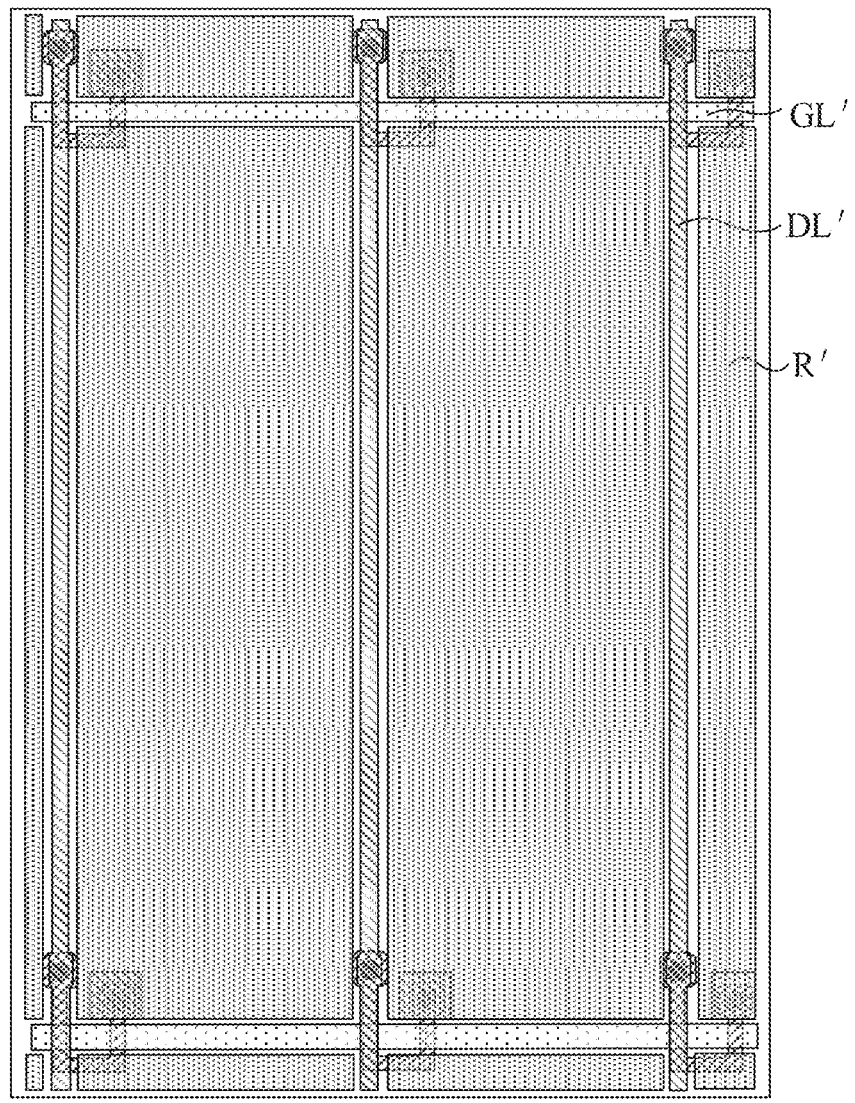
FIG. 1 is a structural diagram of an array substrate, in accordance with an implementation.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art on a basis of the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or examples(s). In addition, the specific features, structures, materials, or characteristics described herein may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined with "first" and "second" may explicitly or implicitly include one or more of the features. In the description of the embodiments of the present disclosure, the term "a plurality of" or "the plurality of" means two or more unless otherwise specified.

In the description of some embodiments, the expressions "connected" and derivatives thereof may be used. For example, the term "connected" may be used in the description of some embodiments to indicate that two or more components are in direct physical contact or electrical contact with each other. The embodiments disclosed herein are not necessarily limited to the content herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

In addition, the phase "based on" as used herein is meant to be open and inclusive, since a process, step, calculation or other action that is "based on" one or more of the stated conditions or values may, in practice, be based on additional conditions or values other than those stated.

The term "about" or "approximately" as used herein includes a stated value and an average value within an acceptable range of deviation of a particular value. The acceptable range of deviation is determined by a person of ordinary skill in the art in consideration of the measurement in question and errors associated with the measurement of a particular quantity (i.e., limitations of a measurement system).

Exemplary embodiments are described herein with reference to sectional views and/or plan views as idealized exemplary accompanying drawings. In the accompanying drawings, thickness of layers and sizes of regions are enlarged for clarity. Variations in shapes with respect to the drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown as a rectangle shape generally has a feature of being curved. Thus, the regions shown in the accompanying drawings are schematic in nature, and their shapes are not intended to show actual shapes of regions in a device, and are not intended to limit the scope of the exemplary embodiments.

In the related art, a main structure of a liquid crystal display (LCD) generally includes an array substrate and an opposite substrate that are disposed opposite to each other, and a liquid crystal layer disposed between the array substrate and the opposite substrate. By supplying driving voltages to the LCD, an electric field capable of driving liquid crystal molecules in the liquid crystal layer to deflect may be generated between the array substrate and the opposite substrate, so that a gray scale display of the LCD is achieved.

According to the type of a light source used in the LCD, the types of the LCD may include a transmission type, a reflective type, a transflective type. The reflective type LCD refers to a LCD in which a reflective layer is disposed in the array substrate, and the LCD uses the reflective layer to reflect natural light incident from the outside, and then uses the reflected natural light to achieve image display. Since the reflective type LCD uses the natural light as the light source, and a backlight source is not required, the power consumption of the reflective type LCD may be greatly reduced, and the endurance time of the reflective type LCD may be effectively improved. For example, the reflective type LCD may be applied to a wearable field or an industrial automation control field, etc.

Figure 2:
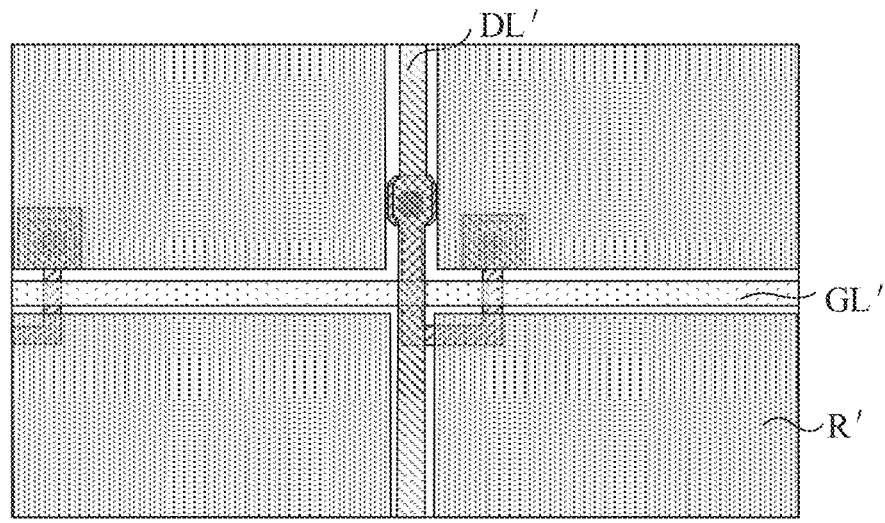
FIG. 2 is a partial enlarged view of the array substrate shown in FIG. 1.

In an implementation, as shown in FIGS. 1 and 2, the array substrate generally includes a plurality of gate lines GL', and a plurality of data lines DL' arranged crosswise with and insulated from the plurality of gate lines GL'. The plurality of gate lines GL' and the plurality of data lines DL' define a plurality of sub-pixel regions. Reflective layers R' included in the array substrate may be arranged in one-to-one correspondence with the plurality of sub-pixel regions. A shape of the reflective layer R' is generally a relatively regular and simple shape, such as a rectangle, so as to simplify the complexity of fabricating the reflective layer.

The process of fabricating the reflective layers R' may be as follows: forming a reflective material film firstly, and then using a photolithography process to pattern the reflective material film to obtain the plurality of reflective layers R'.

Figure 3:
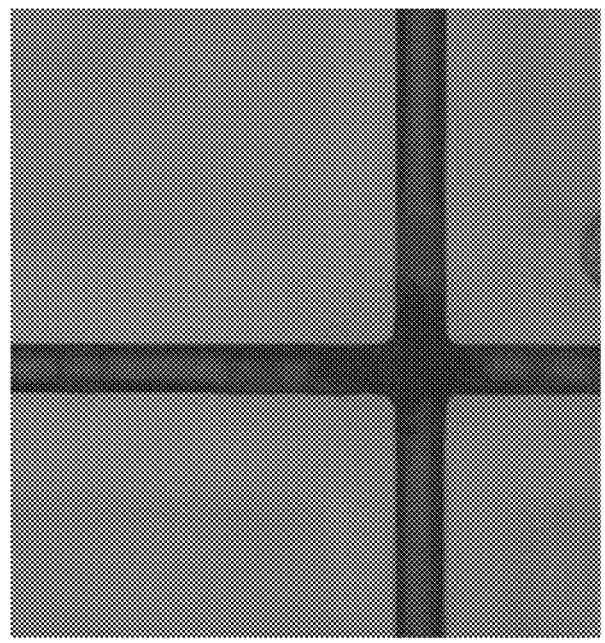
FIG. 3 is a scanning electron microscope (SEM) imaging diagram at an overlapping position of a gate line and a data line, in accordance with an implementation.

It is found through research that in the array substrate, there is a height difference between an overlapping position of the gate line GL' and the data line DL' and other positions (e.g., a position corresponding to a portion of the gate line GL' except for the overlapping position or a position corresponding to a portion of the data line DL' except for the overlapping position). In the process of patterning the reflective material film, it is prone to appear that photosensitive amounts between the photoresist at the overlapping position of the grid line GL' and the data line DL' and the photoresist at other positions are different, and the fluidity of the developing solution at the overlapping position of the grid line GL' and the data line DL' is poor. Therefore, it is likely to cause a poor displacement effect between the developing solution and the photoresist. In this way, after the patterning process is completed and the plurality of reflective layers R' are obtained, residues of the reflective material are likely to occur at the overlapping position of the gate line GL' and the data line DL' (as shown in FIG. 3), which may make adjacent reflective layers short-circuit and easily cause the crosstalk between adjacent sub-pixels regions, thereby resulting in defects of bright spots (or dark spots) of the reflective type LCD.

Figure 4:
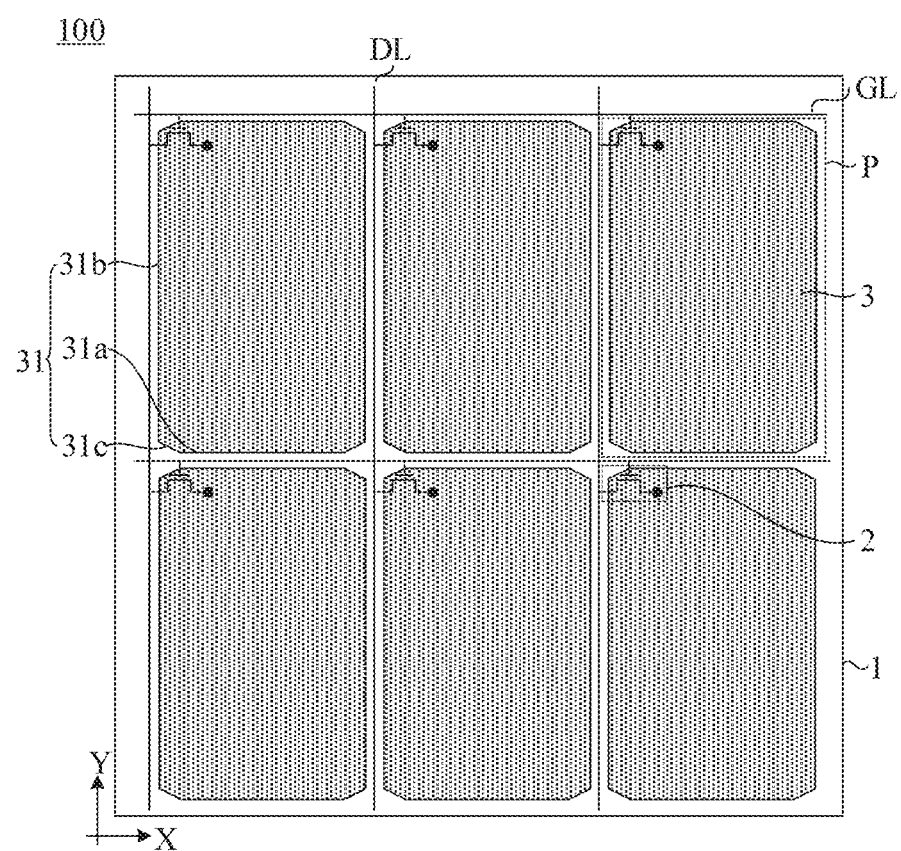
FIG. 4 is a structural diagram of an array substrate, in accordance with some embodiments of the present disclosure.
Figure 5:
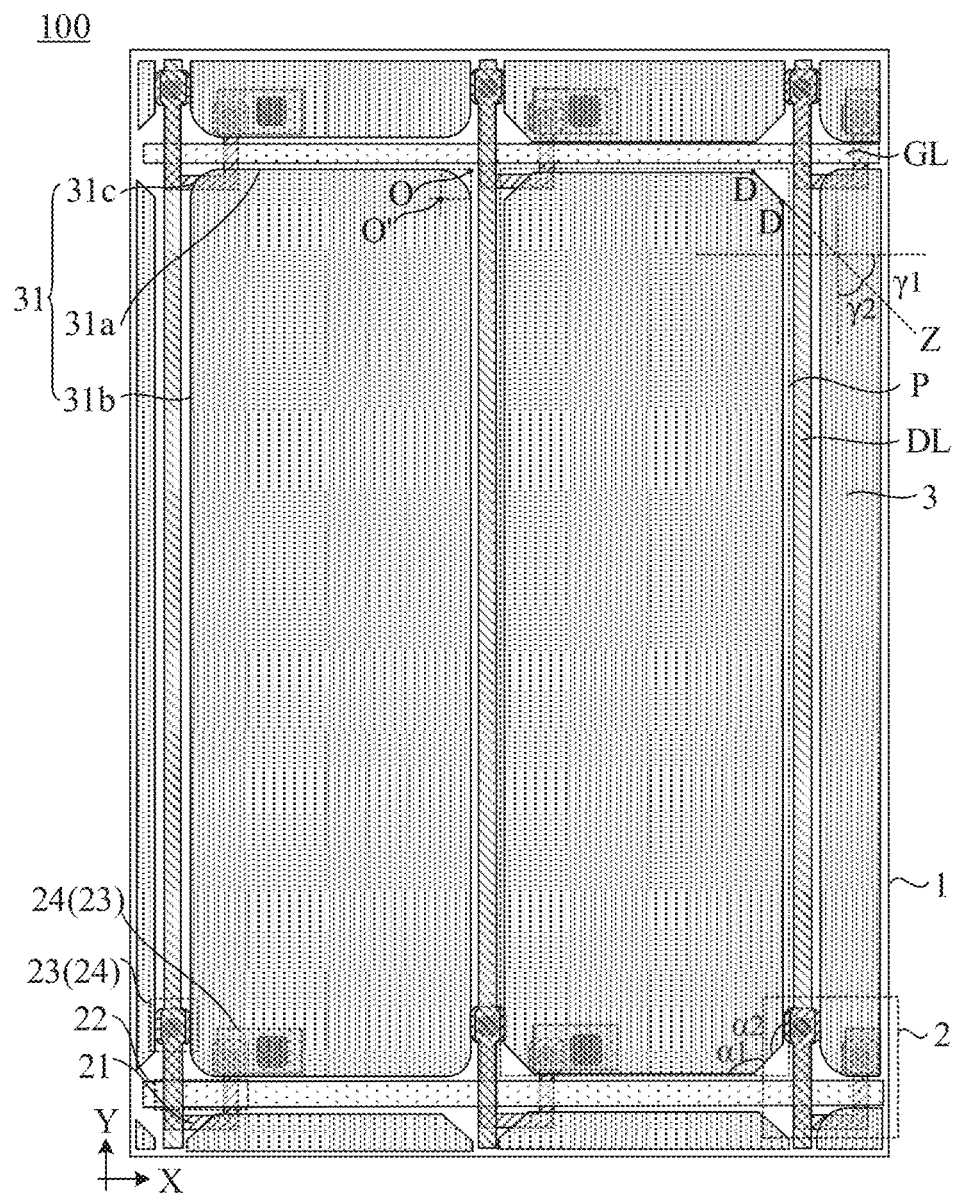
FIG. 5 is a structural diagram of another array substrate, in accordance with some embodiments of the present disclosure.
Figure 6:
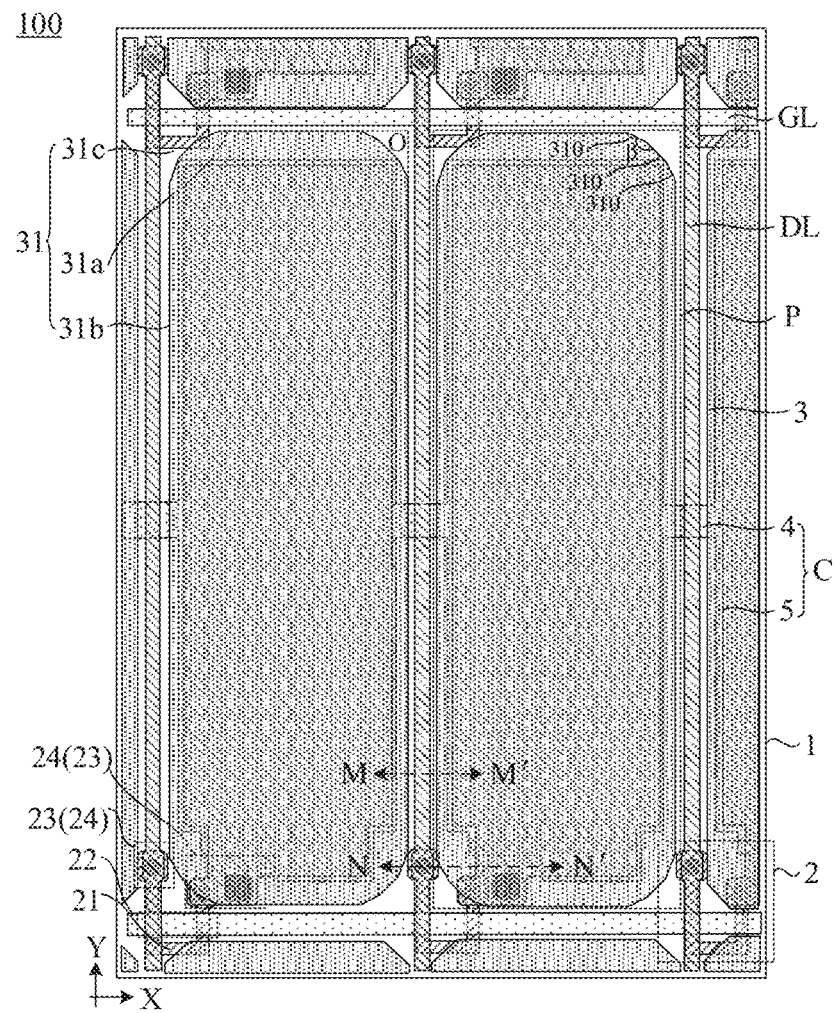
FIG. 6 is a structural diagram of yet another array substrate, in accordance with some embodiments of the present disclosure.

In light of this, as shown in FIGS. 4 to 6, some embodiments of the present disclosure provide an array substrate 100.

In some embodiments, as shown in FIGS. 4 to 6, the array substrate 100 may include a first substrate 1.

The first substrate 1 is of various types, which may be selected according to actual needs.

For example, the first substrate 1 may be a rigid substrate. The rigid substrate may be a glass substrate or a polymethyl methacrylate (PMMA) substrate, etc.

For example, the first substrate 1 may be a flexible substrate. The flexible substrate may be a polyethylene terephthalate (PET) substrate, a polyethylene naphthalate (PEN) substrate or a polyimide (PI) substrate, etc.

In some embodiments, as shown in FIGS. 4 to 6, the array substrate 100 may further include a plurality of gate lines GL and a plurality of data lines DL that are disposed on the first substrate 1.

For example, the plurality of gate lines GL extend in a first direction X, and the plurality of data lines DL extend in a second direction Y. The plurality of data lines DL are located on a side of the plurality of gate lines GL away from the first substrate 1, and the plurality of data lines DL and the plurality of gate lines GL are insulated from each other.

For example, as shown in FIGS. 4 to 6, the first direction X and the second direction Y intersect with each other, which means that the plurality of gate lines GL and the plurality of data lines DL are arranged to cross with each other, so that the plurality of gate lines GL and the plurality of data lines DL may be used to define a plurality of sub-pixel regions P.

Here, an included angle between the first direction X and the second direction Y may be selected according to actual needs. For example, the included angle between the first direction X and the second direction Y may be 85°, 87°, 90°, 91°, 95°, or the like. In a case where the included angle between the first direction X and the second direction Y is 90°, the plurality of gate lines GL and the plurality of data lines DL are perpendicular to each other or substantially perpendicular to each other.

In some embodiments, as shown in FIGS. 4 to 6, the array substrate 100 may further include a plurality of thin film transistors 2 disposed on the first substrate 1.

For example, as shown in FIGS. 4 to 6, a single thin film transistor 2 is located in a sub-pixel region P. That is, the plurality of thin film transistors 2 may be disposed in the plurality of sub-pixel regions P in one-to-one correspondence.

For example, as shown in FIGS. 4 to 6, sub-pixel regions P arranged in a row in the first direction X may be referred to as a same row of sub-pixel regions P, and sub-pixels regions P arranged in a column in the second direction Y may be referred to as a same column of sub-pixel regions P. For example, thin film transistors 2 in the same row of sub-pixel regions P may be electrically connected to a gate line GL, and thin film transistors 2 in the same column of sub-pixel regions P may be electrically connected to a data line DL. The gate line GL may provide a scanning signal to the thin film transistors 2 electrically connected thereto in the same row, so as to control turned-on states of the thin film transistors 2 in the row, and the data line DL may provide a data signal to the thin film transistors 2 electrically connected thereto in the same column.

The plurality of thin film transistors 2 have various arrangements, which may be selected according to actual needs. For example, the plurality of thin film transistors 2 may all be N-type transistors; alternatively, the plurality of thin film transistors 2 may all be P-type transistors; alternatively, a part of the plurality of thin film transistors 2 are N-type transistors, and the other part of the plurality of thin film transistors 2 are P-type transistors. The type of the plurality of thin film transistors 2 may be, for example, low-temperature polysilicon thin film transistors. Of course, the type of the plurality of thin film transistors 2 may not be limited to the low-temperature polysilicon thin film transistors.

The plurality of thin film transistors 2 may be of various structures, which may be selected according to actual needs. For example, the plurality of thin film transistors 2 may all be bottom-gate-type thin film transistors; alternatively, the plurality of thin film transistors 2 may all be top-gate-type thin film transistors; alternatively, a part of the plurality of thin film transistors 2 are bottom-gate-type thin film transistors, and the other part of the plurality of thin film transistors 2 are top-gate-type thin film transistors. Some embodiments of the present disclosure are schematically illustrated by considering an example where the plurality of thin film transistors 2 are all top-gate-type thin film transistors.

In some examples, as shown in FIGS. 4 to 6, 9 and 10, each thin film transistor 2 may include an active layer 21, a gate 22 disposed on a side of the active layer 21 away from the first substrate 1, and a source 23 and a drain 24 disposed on a side of the gate 22 away from the first substrate 1. The source 23 and the drain 24 are each connected to the active layer 21 through a via hole.

For example, as shown in FIGS. 5 and 6, the gate 22 of each thin film transistor 2 may be made of the same material and arranged in the same layer as the plurality of gate lines GL, and connected to a corresponding gate line GL. The source 23 and the drain 24 may be made of the same material and arranged in the same layer as the plurality of data lines DL, and the source 23 or the drain 24 may be connected to a corresponding data line DL.

It will be noted that the "same layer" mentioned herein refers to that a film layer for forming specific patterns is formed by using a same film-forming process, and then a patterning process is performed on the film layer by using a same mask to form a layer structure. Depending on different specific patterns, the patterning process may include several exposure, development and etching processes. Depending on different specific patterns, the patterning process may include several exposure, development or etching processes. The specific patterns in the formed layer structure may be continuous or discontinuous, and these specific patterns may also be at different heights or have different thicknesses. In this way, the gate 22 and the plurality of gate lines GL may be formed simultaneously in a single patterning process, and the source 23, the drain 24 and the plurality of data lines DL may be formed simultaneously in a single patterning process. Therefore, it is beneficial to simplifying the manufacturing process of the array substrate 100.

In some embodiments, as shown in FIGS. 4 to 6, the array substrate 100 may further include a plurality of reflective electrodes 3 disposed on a side of the plurality of thin film transistors 2 away from the first substrate 1. A single reflective electrode 3 is located in the sub-pixel region P. That is, the plurality of reflective electrodes 3 may be disposed in the plurality of sub-pixel regions P in one-to-one correspondence.

In some examples, as shown in FIGS. 4 to 6, the reflective electrode 3 is electrically connected to the thin film transistor 2 located in the same sub-pixel region P. In this case, the reflective electrode 3 may be used as a pixel electrode for displaying an image while reflecting external natural light.

Figure 10:
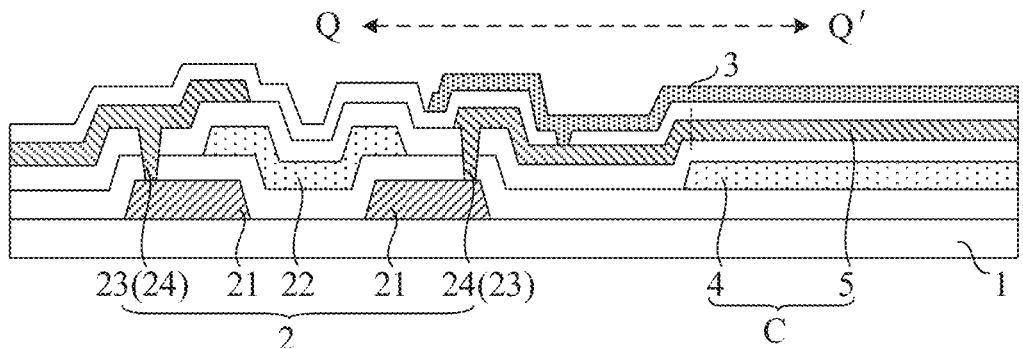
FIG. 10 is a sectional view of the structure shown in FIG. 9 taken along the Q-Q' direction.

For example, as shown in FIG. 10, in a case where the source 23 of the thin film transistor 2 is electrically connected to a corresponding data line DL, the reflective electrode 3 may be electrically connected to the drain 24 of the thin film transistor 2; and in a case where the drain 24 of the thin film transistor 2 is electrically connected to a corresponding data line DL, the reflective electrode 3 may be electrically connected to the source 23 of the thin film transistor 2.

The reflective electrode 3 may be made of various materials, which may be selected according to actual needs. For example, the material of the reflective electrode 3 may be a metal material, such as silver (Ag), copper (Cu), aluminum (Al), or molybdenum (Mo). Alternatively, the material of the reflective electrode 3 may be an alloy material of the metal materials. Here, in an example where the material of the reflective electrode 3 includes Ag, the material of the reflective electrode 3 may further include indium tin oxide (ITO), so that a structure of the reflective electrode 3 is a laminated structure of ITO/Ag/ITO. In this way, ITO may be used to protect Ag, so as to prevent Ag from being oxidized.

The reflective electrode 3 may be of various structures, which may be selected according to actual needs. For example, the reflective electrode 3 may be a block electrode. Alternatively, the reflective electrode 3 may be an electrode with slits.

Figure 9:
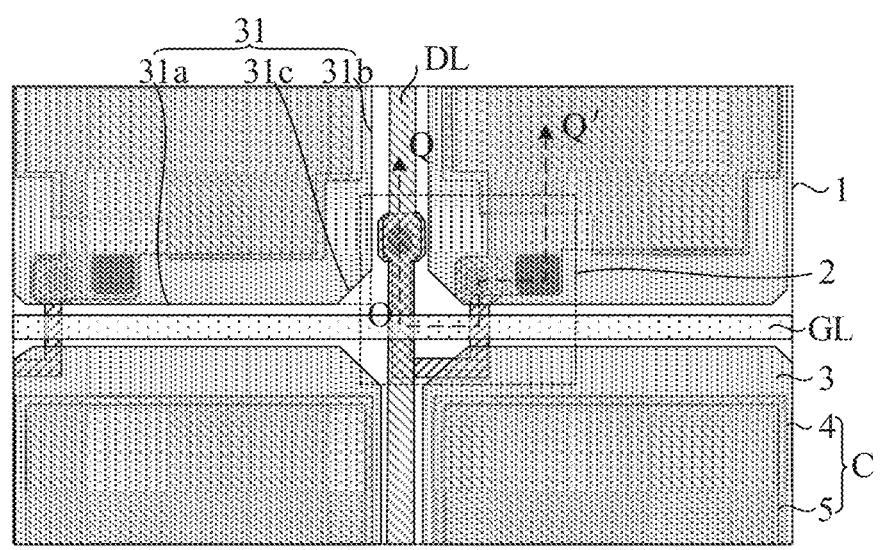
FIG. 9 is an enlarged view of a partial structure of the array substrate shown in FIG. 6.

In some examples, as shown in FIGS. 5, 6 and 9, each reflective electrode 3 has a border 31, which includes a plurality of first sub-borders 31a extending in the first direction X, a plurality of second sub-borders 31b extending in the second direction Y, and a plurality of chamfer borders 31c each connecting a first sub-border 31a and a second sub-border 31b that are adjacent.

For example, as shown in FIGS. 5, 6 and 9, an intersection O of extension lines of a first sub-border 31a and a second sub-border 31b that are adjacent is located outside the border 31 of the reflective electrode 3.

Here, as shown in FIGS. 5, 6 and 9, the intersection O of the extension lines of the first sub-border 31a and the second sub-border 31b that are adjacent is proximate to an overlapping position of a corresponding gate line GL and a corresponding data line DL. That is to say, a chamfer border 31c connected to the first sub-border 31a and the second sub-border 31b that are adjacent is further away from the overlapping position of the corresponding gate line GL and the corresponding data line DL than the intersection O of the extension lines of the first sub-border 31a and the second sub-border 31b that are adjacent, and a spacing between the chamfer border 31c and the overlapping position is larger than a spacing between the intersection O of the extension lines of the first sub-border 31a and the second sub-border 31b that are adjacent and the overlapping position. In this way, portions of adjacent reflective electrodes 3 corresponding to the overlapping position may have a large spacing therebetween, and thus in a process of forming the reflective electrodes 3, the fluidity of the developing solution and the displacement effect between the developing solution and the photoresist may be improved, which may prevent residues of materials of the reflective electrodes at the portions of the adjacent reflective electrodes 3 located in the overlapping position.

The overlapping position of the corresponding gate line GL and the corresponding data line DL refers to an overlapping position, between the gate line GL and the data line DL, with the smallest spacing from the intersection O of the extension lines of the first sub-border 31a and the second sub-border 31b that are adjacent.

Therefore, in the array substrate 100 provided in some embodiments of the present disclosure, the chamfer border 31c is disposed between the first sub-border 31a of the reflective electrode 3 and the second sub-border 31b of the reflective electrode 3, and the intersection O of the extension lines of the first sub-border 31a and the second sub-border 31b that are adjacent is located outside the border 31 of the reflective electrode 3. As a result, the spacing between the chamfer border 31c and the overlapping position of the corresponding gate line GL and the corresponding data line DL is greater than the spacing between the intersection O and the overlapping position of the gate line GL and the data line DL, and thus the portions of the adjacent reflective electrodes 3 corresponding to the overlapping position have the large spacing therebetween. In this way, in the process of forming the reflective electrodes 3, a large flowing space may be provided for the developing solution, which may effectively improve the fluidity of the developing solution and the displacement effect between the developing solution and the photoresist, thereby avoiding a situation that the materials of the reflective electrodes are residual at the portions of the adjacent reflective electrodes 3 located in the overlapping position. In a case where the array substrate 100 is applied to a display apparatus, the crosstalk between adjacent sub-pixel regions P may be avoided, and the defects of bright spots (or dark spots) may be improved, thereby improving the display effect.

It will be noted that there are various arrangements of the chamfer border 31c, which may be selected according to actual needs.

In some embodiments, shapes of the plurality of chamfer borders 31c included in the same reflective electrode 3 are the same or substantially the same; and/or, lengths of the plurality of chamfer borders 31c included in the same reflective electrode 3 are equal or substantially equal.

That is, the plurality of chamfer borders 31c included in the same reflective electrode 3 have the same or substantially the same shapes, or have equal or substantially equal lengths, or both have the same or substantially the same shapes and equal or substantially equal lengths.

In this way, it may facilitate the pattern design of the reflective electrode 3, and it is conducive to reducing the complexity of the reflective electrode 3.

In some other embodiments, shapes of chamfer borders 31c included in different reflective electrodes 3 are the same or substantially the same; and/or, lengths of the chamfer borders 31c included in the different reflective electrodes 3 are equal or substantially equal.

That is, the chamfer borders 31c included in different reflective electrodes 3 have the same or substantially the same shapes, or have equal or substantially equal lengths, or both have the same or substantially the same shapes and equal or substantially equal lengths.

In this way, not only the complexity of fabricating the reflective electrodes 3 can be further reduced, thereby facilitating the pattern design of the reflective electrodes 3, but also a large spacing between the portions of the adjacent reflective electrodes 3 corresponding to the overlapping position of the corresponding gate line GL and the corresponding data line DL may be ensured, thereby ensuring the improved effect of the residues of the materials of the reflective electrodes between the adjacent reflective electrodes 3.

The plurality of chamfer borders 31c included in the reflective electrode 3 may be of various shapes, which may be selected according to actual needs.

In some examples, the shapes of the plurality of chamfer borders 31c each include at least one of a straight-line shape, a curved shape, and a broken-line shape. Of course, the shape of the chamfer border 31c is not limited to the several types schematically described above. The chamfer border 31c will be schematically described below with reference to the accompanying drawings.

For example, as shown in FIGS. 5 and 9, the shapes of the plurality of chamfer borders 31c may include the straight-line shapes. In this case, an included angle α1 between the straight-line-shaped chamfer border 31c and a first sub-border 31a connected thereto is an obtuse angle, and an included angle α2 between the straight-line-shaped chamfer border 31c and a second sub-border 31b connected thereto is an obtuse angle.

This may be equivalent to removing a portion of the reflective electrode 3 proximate to the overlapping position of the gate line GL and the data line DL, that is, removing a sharp coiner of the reflective electrode 3 and performing a chamfering process on the reflective electrode 3, so as to prevent the border 31 of the reflective electrode 3 from forming a tip at the overlapping position.

In this way, not only the pattern design of the reflective electrode 3 is facilitated, thereby avoiding increasing the complexity of fabricating the reflective electrode 3, but also the spacing between the chamfer border 31c and the overlapping position may be ensured to be greater than the spacing between the intersection O of the extension lines of the first sub-border 31a and the second sub-border 31b that are connected to the chamfer border 31c and the overlapping position, thereby ensuring the improved effect of the phenomenon that the materials of the reflective electrodes are residual between adjacent reflective electrodes 3.

In addition, the chamfering design for the reflective electrode 3 may avoid a phenomenon of point discharge between the adjacent reflective electrodes 3 or between the reflective electrode 3 and an adjacent data line DL, thereby improving an anti-electro-static discharge (anti-ESD) capability of the array substrate 100.

For example, as shown in FIG. 5, the shapes of the plurality of chamfer borders 31c may include the curved shapes. In this case, a center of curvature O' of the curved-shaped chamfer border 31c is located within the border 31 of the reflective electrode 3. That is, the chamfer border 31c protrudes toward the overlapping position of the corresponding gate line GL and the corresponding data line DL.

By arranging the shape of the chamfer border 31c to be the curved shape, it is possible to not only avoid increasing the complexity of fabricating the reflective electrode 3, but also ensure that the spacing between the chamfer border 31c and the overlapping position is greater than the spacing between the intersection O of the extension lines of the first sub-border 31a and second sub-border 31b that are connected to the chamfer border 31c and the overlapping position, thereby ensuring the improved effect of the phenomenon that the materials of the reflective electrodes are remained between the adjacent reflective electrodes 3.

By arranging the center of curvature of the curved chamfer border 31c within the border 31 of the reflective electrode 3, it may be ensured that a portion of the reflective electrode 3 corresponding to the overlapping position protrudes toward the overlapping position, rather than being sunken toward the inside of the reflective electrode 3. In this way, it is possible to not only prevent the chamfer border 31c from forming a tip, but also avoid forming a tip at a position where the chamfer border 31c is connected to the first sub-border 31a or a position where the chamfer border 31c is connected to the second sub-border 31b, thereby effectively improving the anti-ESD capability of the array substrate 100.

Here, the curved shape may be, for example, a wave shape or an arc shape.

For example, as shown in FIG. 6, the shapes of the plurality of chamfer borders 31c include the broken-line shapes. In this case, the broken-line-shaped chamfer border 31c includes at least two line segments 310 sequentially connected, and an included angle β between two adjacent line segments 310 is an obtuse angle.

Here, the number of the line segments included in the broken-line-shaped chamfer border 31c may be, for example, two, three, four, or five. Regardless of the number of line segments, the included angle between two adjacent line segments is the obtuse angle, so as to avoid forming a tip in the chamfer border 31c.

The shape of the chamfering border 31c is arranged to be the broken-line shape, and the included angle between two adjacent line segments in the line segments included in the broken-line-shaped chamfer border 31c is set to be the obtuse angle. As a result, it may not only effectively increase the spacing between the chamfer border 31c and the overlapping position, thereby ensuring the improved effect of the phenomenon that the materials of the reflective electrodes are remained between the adjacent reflective electrodes 3, but also avoid forming a tip at the portion of the reflective electrode 3 corresponding to the overlapping position, thereby effectively improving the anti-ESD capability of the array substrate 100.

In some embodiments, as shown in FIG. 5, an included angle γ1 between a connecting direction Z of two end points D of one of at least two chamfer borders 31*c* and the first direction X is equal or substantially equal to an included angle γ1 between a connecting direction Z of two end points D of another of the at least two chamfer borders 31*c* and the first direction X; and/or, an included angle γ2 between a connecting direction Z of two end points D of one of at least two chamfer borders 31*c* and the second direction Y is equal or substantially equal to an included angle γ2 between a connecting direction Z of two end points D of another of the at least two chamfer borders 31*c* and the second direction Y.

In some examples, the included angles, each between the connecting direction of the two end points D of a chamfer border 31*c* in only two chamfer borders 31*c* and the first direction X, are equal or substantially equal. Alternatively, the included angles, each between the connecting direction of the two end points D of a chamfer border 31*c* in chamfer borders 31*c* (e.g., all the chamfer borders 31*c*) and the first direction X, are equal or substantially equal.

In some other examples, the included angles, each between the connecting direction of the two end points D of a chamfer border 31*c* in only two chamfer borders 31*c* and the second direction Y, are equal or substantially equal. Alternatively, the included angles, each between the connecting direction of the two end points D of a chamfer border 31*c* in chamfer borders 31*c* (e.g., all the chamfer borders 31*c*) and the second direction Y are equal or substantially equal.

By setting the included angle between the connection direction of two end points D of the chamfer border 31*c* and the first direction X and/or the included angle between the connection direction of two end points D of the chamfer border 31*c* and the second direction Y, it is possible to effectively reduce the complexity of fabricating the reflective electrode 3, and achieve the control of the spacing between the chamfer border 31*c* and the overlapping position. Therefore, it may avoid affecting normal display of a display apparatus to which the array substrate 100 is applied while ensuring the improved effect of the phenomenon that the materials of the reflective electrodes are remained between the adjacent reflective electrodes.

The included angle between the connecting direction of the two end points D of the chamfer border 31*c* and the first direction X and/or the included angle between the connection direction of the two end points D of the chamfer border 31*c* and the second direction Y will be schematically described below.

In some examples, as shown in FIG. 5, the first direction X and the second direction Y are perpendicular to or substantially perpendicular to each other. The connecting direction of the two end points D of each of the at least two chamfer borders 31*c* (e.g., two, three or all chamfer borders 31*c*) and the first direction X have an included angle of 45°, and the connecting direction of the two end points D of each of the at least two chamfer borders 31*c* (e.g., two, three or all chamfer borders 31*c*) and the second direction Y have an included angle of 45°.

In this case, it is conducive to making spacings between different chamfer borders 31*c* and the overlapping position have a small difference or making the spacings between different chamfer borders 31*c* and the overlapping position equal. Thus, it is possible to effectively improve the phenomenon that the materials of the reflective electrodes are remained between the adjacent reflective electrodes 3, and provide a good condition for forming structures subsequently.

In some examples, as shown in FIGS. 5 and 6, the plurality of first sub-borders 31*a* included in the border 31 of the reflective electrode 3 include two first sub-borders 31*a* disposed oppositely, and the plurality of second sub-borders 31*b* included in the border 31 of the reflective electrode 3 include two second sub-borders 31*b* disposed oppositely, and the plurality of chamfer borders 31*c* included in the border 31 of the reflective electrode 3 include four chamfer borders 31*c*. A chamfer border 31*c* is connected between a first sub-border 31*a* and a second sub-border 31*b* that are adjacent.

For example, one of the two first sub-borders 31*a*, a four chamfer border 31*c*, one of the two second sub-borders 31*b*, another four chamfer border 31*c*, the other of the two first sub-borders 31*a*, yet another four chamfer border 31*c*, the other of the two second sub-borders 31*b*, and yet another four chamfer border 31*c* may be sequentially connected in series to form a closed pattern, which constitutes the border 31 of the reflective electrode 3. The reflective electrode 3 may be of a rectangle with chamfers. In this case, the four chamfer borders 31*c* of each reflective electrode 3 may be of, for example, straight-line shapes, and the included angle between the chamfer border 31*c* and the first direction X and the included angle between the chamfer border 31*c* and the second direction Y may both be 45°.

In this way, it is possible to effectively improve the phenomenon that the materials of the reflective electrodes are remained between the adjacent reflective electrodes 3, and make chamfer borders 31*c* and their extension lines of every adjacent four reflective electrodes 3 form a rectangular region, which provides a good space for structures formed subsequently in the rectangular region.

In some embodiments, as shown in FIG. 6, the array substrate 100 may further include a plurality of first electrodes 4 with the same material and disposed in the same layer as the plurality of gate lines GL, and a plurality of second electrodes 5 with the same material and disposed in the same layer as the plurality of data lines DL. A single first electrode 4 is located in the sub-pixel region P, and a single second electrode 5 is located in the sub-pixel region P. The first electrode 4 and the second electrode 5 that are located in the same sub-pixel region P constitute a storage capacitor C.

The plurality of first electrodes 4 and the plurality of gate lines GL are arranged in the same layer, so that the plurality of first electrodes 4 and the plurality of gate lines GL may be formed simultaneously in a single patterning process. The plurality of second electrodes 5 and the plurality of data lines DL are arranged in the same layer, so that the plurality of second electrodes 5 and the plurality of data lines DL may be formed simultaneously in a single patterning process. In this way, it is conducive to simplifying the manufacturing process of the array substrate 100.

In some examples, as shown in FIGS. 6, 9 and 10, in a case where the reflective electrode 3 is electrically connected to a source 23 of a thin film transistor 2 located in the same sub-pixel region P as the reflective electrode 3, the second electrode 5 may be electrically connected to and form a one-piece structure with the source 23 of the thin film transistor 2 located in the same sub-pixel region P as the reflective electrode 3. In a case where the reflective electrode 3 is electrically connected to a drain 24 of the thin film transistor 2 located in the same sub-pixel region P as the reflective electrode 3, the second electrode 5 may be electrically connected to and form a one-piece structure with the drain 24 of the thin film transistor 2 located in the same sub-pixel region P as the reflective electrode 3.

That is to say, both the second electrode 5 and the reflective electrode 3 are electrically connected to the source 23 or the drain 24 of the thin film transistor 2. In a process of transmitting a data signal in the data line DL to the reflective electrode 3 through the thin film transistor 2, the data signal will also be simultaneously transmitted to the second electrode 5.

In some examples, as shown in FIG. 6, first electrodes 4 in the same row of sub-pixel regions P may be connected to each other and of a one-piece structure. An electrical signal transmitted in the first electrode 4 may be, for example, a common voltage signal.

For example, in the process of transmitting the data signal by the data line DL, a crosstalk rate of the data line DL to the sub-pixel region P is:

Crosstalk(n) $\% = C_{pd}/(C_{lc}+C_{st})$; where $C_{pd}$ represents a coupling capacitance of the data line DL to the reflective electrode 3, $C_{lc}$ represents a liquid crystal capacitance in a case where the array substrate 100 is applied to a display apparatus, and $C_{st}$ represents the capacitance of a storage capacitor C constituted by the first electrode 4 and the second electrode 5.

It can be seen from the above that by arranging the storage capacitor C in each sub-pixel region P, the capacitance of the storage capacitor C may be used as a compensating capacitance to reduce the crosstalk rate of the data line DL to the sub-pixel region P, thereby improving the display effect of the array substrate 100 and the display apparatus to which the array substrate 100 is applied.

It will be noted that the "one-piece structure" mentioned herein means that the specific pattern formed by a single patterning process is continuous and non-disconnected.

In some examples, as shown in FIGS. 6, 9 and 10, in the same sub-pixel region P, a portion of an orthogonal projection of the second electrode 5 on the first substrate 1 is located within an orthogonal projection of the first electrode 4 on the first substrate 1.

In this case, a portion of a border of the orthogonal projection of the second electrode 5 on the first substrate 1 may coincide with a portion of a border of the orthogonal projection of the first electrode 4 on the first substrate 1, and a minimum spacing between another portion of the border of the orthogonal projection of the second electrode 5 on the first substrate 1 and another portion of the border of the orthogonal projection of the first electrode 4 on the first substrate 1 is greater than 0 µm. Alternatively, the minimum spacing between the border of the orthogonal projection of the second electrode 5 on the first substrate 1 and the border of the orthogonal projection of the first electrode 4 on the first substrate 1 is greater than 0 µm.

Considering that the process of forming the first electrode 4 and the process of forming the second electrode 5 will inevitably have certain errors, by arranging the orthogonal projection of the second electrode 5 on the first substrate 1 to be located within the orthogonal projection of the first electrode 4 on the first substrate 1 in the embodiments of the present disclosure, a large relative area between the first electrode 4 and the second electrode 5 may be ensured, thereby ensuing that the storage capacitor C can have a large capacitance to store a plurality of charges. As a result, it is possible to effectively reduce the crosstalk rate of the data line DL to the sub-pixel region P, and improve the display effect of the array substrate 100 and the display apparatus to which the array substrate 100 is applied.

It will be noted that the minimum spacing between the two borders refers to a spacing between portions, proximate to each other, of the two borders.

For example, the minimum spacing between the border of the orthogonal projection of the second electrode 5 on the first substrate 1 and the border of the orthogonal projection of the first electrode 4 on the first substrate 1 is greater than or equal to 1 µm, and less than or equal to 10% of a spacing between two adjacent data lines.

In this way, it is conducive to further ensuring a large relative area between the first electrode 4 and the second electrode 5, and it is conducive to further reducing the crosstalk rate of the data line DL to the sub-pixel region P, and improving the display effect of the array substrate 100 and the display apparatus to which the array substrate 100 is applied.

For example, the minimum spacing between the border of the orthogonal projection of the second electrode 5 on the first substrate 1 and the border of the orthogonal projection of the first electrode 4 on the first substrate 1 may be 1 µm, 1.1 µm or 10% of the spacing between two adjacent data lines.

Figure 7:
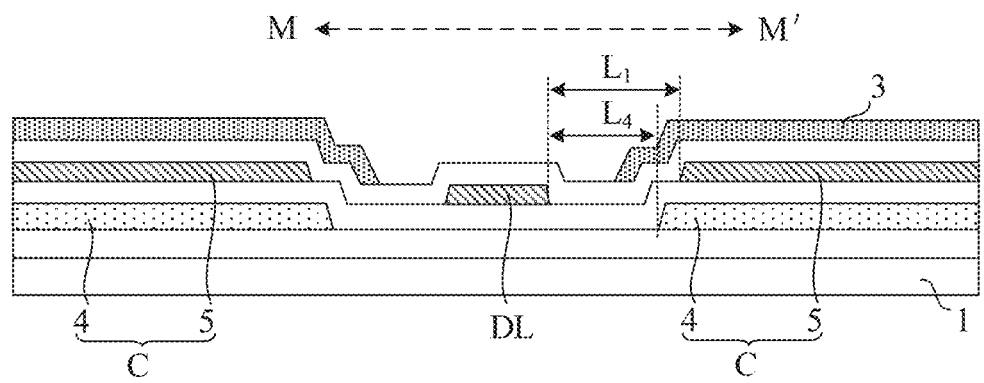
FIG. 7 is a sectional view of the array substrate shown in FIG. 6 taken along the M-M' direction.

In some examples, as shown in FIGS. 6 and 7, a minimum spacing between the border of the orthogonal projection of the second electrode 5 on the first substrate 1 and a border of an orthogonal projection of a data line DL adjacent to the second electrode 5 on the first substrate 1 is a first preset value $L_1$, and the first preset value $L_1$ is greater than or equal to 3 µm, and less than or equal to 40% of the spacing between two adjacent data lines. For example, the first preset value $L_1$ may be 3 µm, 3.1 µm, or 40% of the spacing between two adjacent data lines.

In this way, it may not only ensure that both the first electrode 4 and the second electrode 5 have large areas, so that there is a large relative area between the first electrode 4 and the second electrode 5 and the storage capacitor C has a large amount of charges, but also avoid forming a large coupling capacitance between the data line DL and the second electrode 5.

It will be noted that, in the case where the second electrode 5 is electrically connected to the source 23 of the thin film transistor 2 located in the same sub-pixel region P as the second electrode 5, the drain 24 of the thin film transistor 2 may be electrically connected to and form a one-piece structure with a corresponding data line DL. Since the drain 24 is connected to the active layer 21 of the thin film transistor 2 through a via hole, a dimension of a portion of the data line DL corresponding to the drain 24 in the first direction X is greater than a dimension of the remaining portion of the data line DL in the first direction X.

Figure 8:
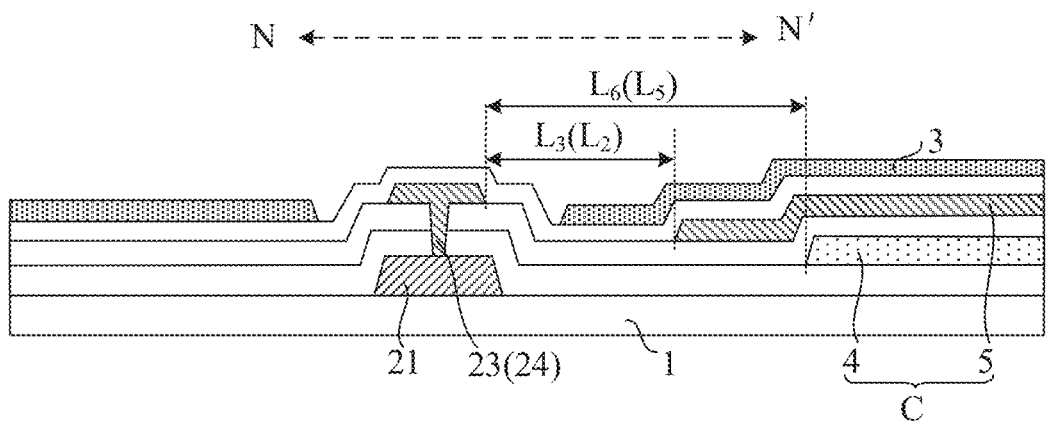
FIG. 8 is a sectional view of the array substrate shown in FIG. 6 taken along the N-N' direction.

On this basis, as shown in FIGS. 6 to 8, a portion of the second electrode 5 corresponding to the drain 24 is arranged inward, so that a spacing (i.e., a second preset value $L_2$), in the first direction X, between the border of the orthogonal projection of the second electrode 5 on the first substrate 1 and the border of the orthogonal projection of the drain 24 of the thin film transistor 2 located in the same sub-pixel region P as the second electrode 5 on the first substrate 1 is greater than or equal to the first preset value $L_1$. In this way, it is conducive to reducing the coupling capacitance between the data line DL and the second electrode 5, and further reducing the coupling capacitance of the data line DL to the reflective electrode 3 $C_{pd}$, which may effectively reduce the crosstalk rate of the data line DL to the sub-pixel region P.

Similarly, in the case where the second electrode 5 is electrically connected to the drain 24 of the thin film transistor 2 located in the same sub-pixel region P as the second electrode 5, the source 23 of the thin film transistor 2 may be electrically connected to and form a one-piece structure with the corresponding data line DL, and a dimension of a portion of the data line corresponding to the source 23 in the first direction X is greater than a dimension of the remaining portion of the data line in the first direction X.

On this basis, as shown in FIGS. 6 and 8, a portion of the second electrode 5 corresponding to the source 23 is arranged inward, so that a spacing (i.e., a third preset value $L_3$), in the first direction X, between the border of the orthogonal projection of the second electrode 5 on the first substrate 1 and the border of the orthogonal projection of the source 23 of the thin film transistor 2 located in the same sub-pixel region P as the second electrode 5 on the first substrate 1 is greater than or equal to the first preset value $L_1$. In this way, it is conducive to reducing the coupling capacitance between the data line DL and the second electrode 5, and further reducing the coupling capacitance of the data line DL to the reflective electrode 3 $C_{pd}$, which may effectively reduce the crosstalk rate of the data line DL to the sub-pixel region P.

In some examples, as shown in FIGS. 6 to 8, a minimum spacing between the border of the orthogonal projection of the first electrode 4 on the first substrate 1 and a border of an orthogonal projection of a data line DL adjacent to the first electrode 4 on the first substrate 1 is a fourth preset value $L_4$.

For example, in the case where the second electrode 5 is electrically connected to the source 23 of the thin film transistor 2 located in the same sub-pixel region P as the second electrode 5, a maximum spacing, in the first direction X, between the border of the orthogonal projection of the first electrode 4 on the first substrate 1 and a border of the orthogonal projection of the drain 24 of the thin film transistor 2 located in the same sub-pixel region P as the first electrode 4 on the first substrate 1 is a fifth preset value $L_5$, and the fifth preset value $L_5$ is greater than or equal to the fourth preset value $L_4$. That is, a portion of the first electrode 4 corresponding to the drain 24 is arranged inward. In this way, it is possible to increase the spacing between the first electrode 4 and the data line DL, reduce the coupling capacitance between the data line DL and the first electrode 4, and improve the charging capability of the storage capacitor C.

For example, in the case where the second electrode 5 is electrically connected to the drain 24 of the thin film transistor 2 located in the same sub-pixel region P as the second electrode 5, a maximum spacing, in the first direction X, between the border of the orthogonal projection of the first electrode 4 on the first substrate 1 and a border of the orthogonal projection of the source 23 of the thin film transistor 2 located in the same sub-pixel region P as the first electrode 4 on the first substrate 1 is a sixth preset value $L_6$, and the sixth preset value $L_6$ is greater than or equal to the fourth preset value $L_4$. That is, a portion of the first electrode 4 corresponding to the source 23 is arranged inward. In this way, it is possible to increase the spacing between the first electrode 4 and the data line DL, reduce the coupling capacitance between the data line DL and the first electrode 4, and improve the charging capability of the storage capacitor C.

Figure 14:
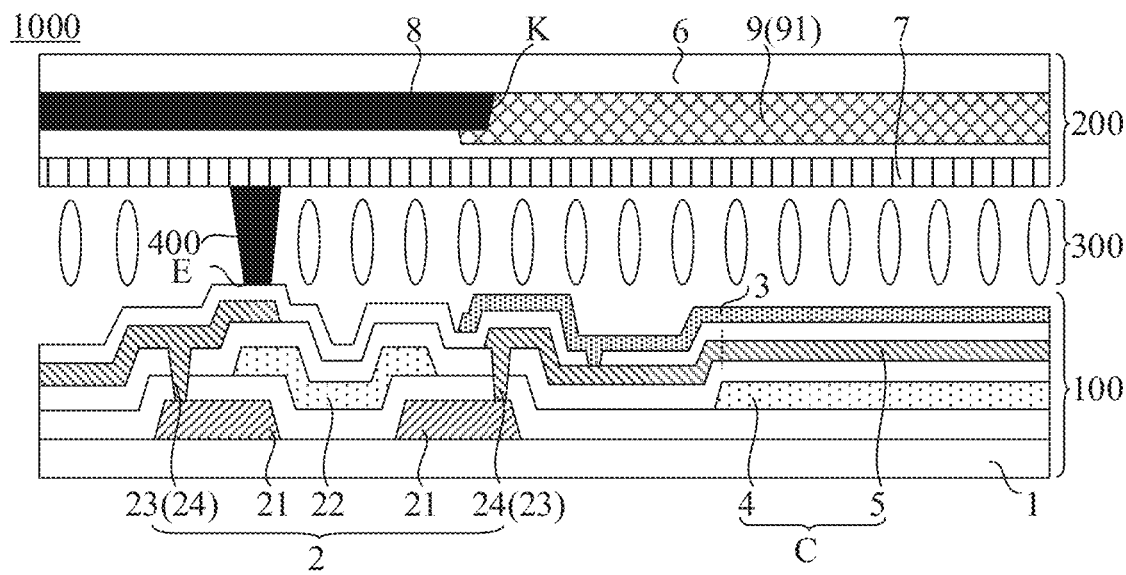
FIG. 14 is a structural diagram of a display apparatus, in accordance with some embodiments of the present disclosure.

Some embodiments of the present disclosure provide a display apparatus 1000. As shown in FIG. 14, the display apparatus 1000 includes the array substrate 100 described in some of the above embodiments, an opposite substrate 200 disposed opposite to the array substrate 100, and a liquid crystal layer 300 disposed between the array substrate 100 and the opposite substrate 200.

The liquid crystal layer 300 includes various types of liquid crystal molecules. For example, the liquid crystal molecules are positive liquid crystal molecules. Alternatively, the liquid crystal molecules are negative liquid crystal molecules.

In some examples, as shown in FIG. 14, the opposite substrate 200 includes a second substrate 6 and a common electrode layer 7 disposed on a side of the second substrate 6 proximate to the array substrate. The second substrate 6 may be of the same structure as the first substrate 1, and the common electrode layer 7 is of, for example, a whole-layer structure.

The data signal is input into the reflective electrode 3 in the array substrate 100, and the common voltage signal is input into the common electrode layer 7 in the opposite substrate 200. In this way, an electric field may be generated between the array substrate 100 and the opposite substrate 200, so as to drive the liquid crystal molecules in the liquid crystal layer 300 to deflect, so that the image display of the display apparatus 1000 may be achieved.

In this case, the display apparatus 1000 may be referred to as a display apparatus with a twisted nematic (TN) display mode. Of course, the display apparatus 1000 provided by the embodiments of the present disclosure is not limited thereto. For example, the common electrode layer 7 is disposed on the array substrate 100, so that the display apparatus 1000 may be a display apparatus with an in-plane switching (IPS) display mode, or a display apparatus with an advanced super dimension switch (ADS) display mode.

In some examples, as shown in FIG. 14, the display apparatus 1000 may further include a plurality of spacers 400 disposed on a side of the opposite substrate 200 proximate to the array substrate 100.

Here, considering an example where the display apparatus 1000 is the display apparatus with the TN display mode, the plurality of spacers 400 may be located on a side of the common electrode layer 7 proximate to the array substrate 100.

Figure 16:
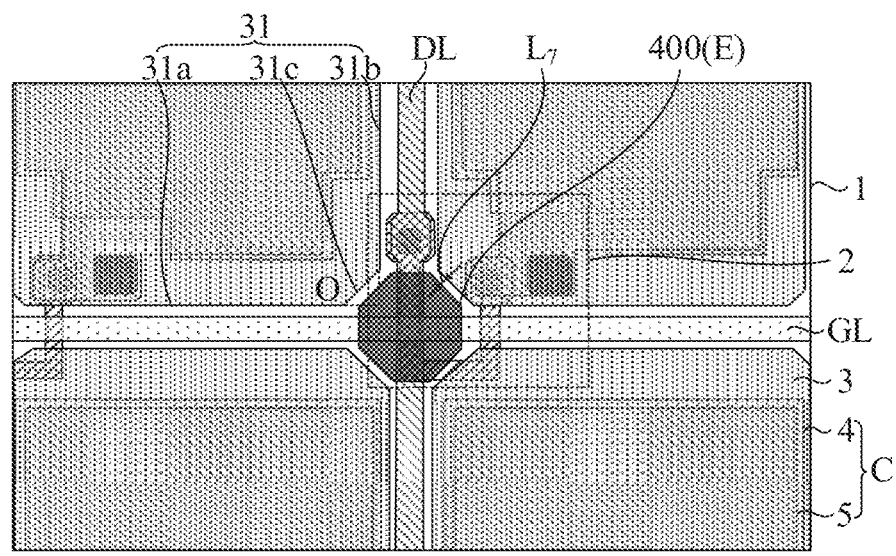
FIG. 16 is a structural diagram of yet another display apparatus, in accordance with some embodiments of the present disclosure.
Figure 17:
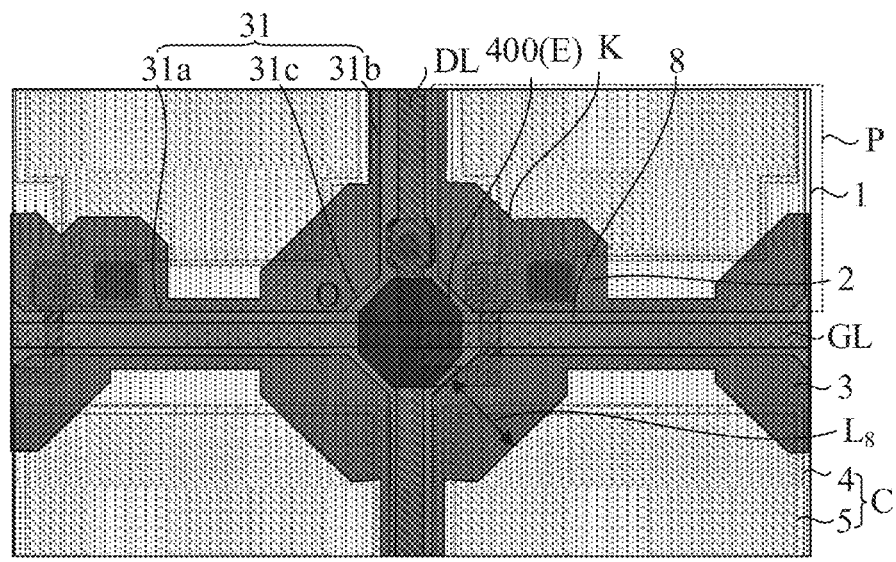
FIG. 17 is a structural diagram of yet another display apparatus, in accordance with some embodiments of the present disclosure.

For example, as shown in FIGS. 16 and 17, an end surface E of a spacer 400 proximate to the array substrate 100 corresponds to an overlapping position of a gate line GL and a data line DL in the array substrate 100. In this way, it is possible to prevent the spacer 400 from adversely affecting the display effect of the display apparatus 1000.

Figure 15:
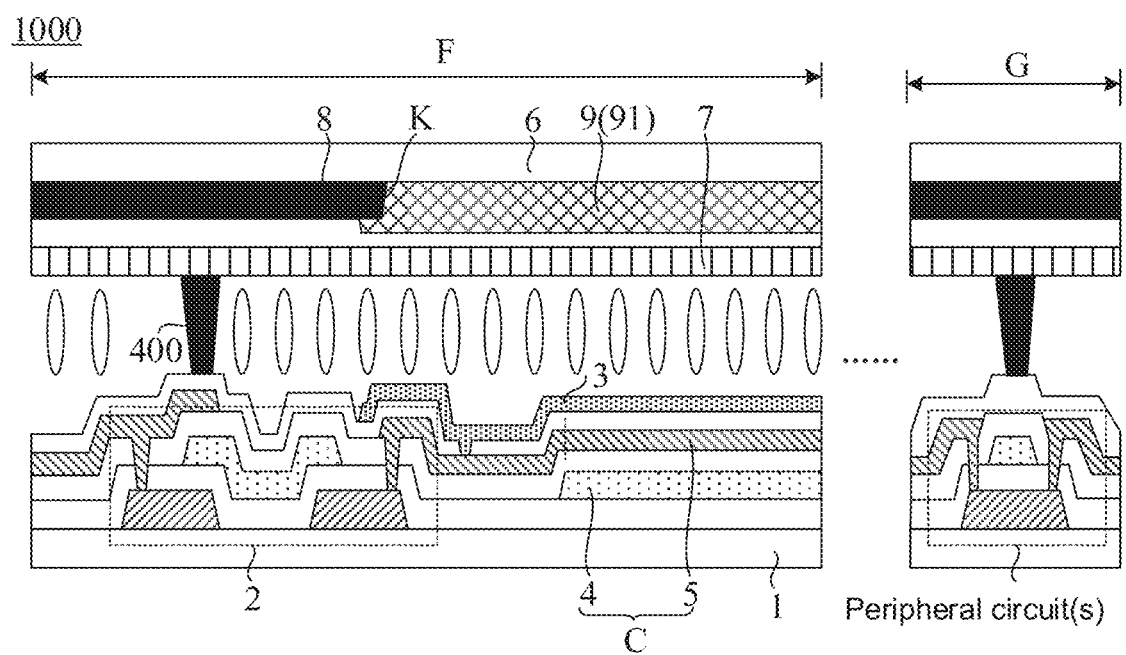
FIG. 15 is a structural diagram of another display apparatus, in accordance with some embodiments of the present disclosure.

It will be noted that, as shown in FIG. 15, the display apparatus 1000 includes a display region F and a frame region G beside the display region F, where the "beside" refers to on one side, two sides, peripheral sides or the like of the display region F. In this case, the frame region G is located on one side or two sides of the display region F; alternatively, the frame region G is disposed around the display region F.

For example, as shown in FIG. 15, a part of the plurality of spacers 400 are located in the display region F, and the other part of the plurality of spacers 400 may be located in the frame region G.

The plurality of spacers 400 may be referred to as main spacers. As shown in FIG. 15, after the array substrate 100 is assembled with the opposite substrate 200 to form a cell, the plurality of spacers 400 will abut against the array substrate 1, and generate a certain amount of compression to be in a compression state, which provides a main support for a cell gap (e.g., about 2.5 μm) of the display apparatus 1000.

For example, as shown in FIG. 16, the end surface E of the spacer 400 proximate to the array substrate 100 is located in a region surrounded by the chamfer borders 31c of reflective electrodes 3 adjacent to the overlapping position in the array substrate 100. That is, the end surface E of the spacer 400 proximate to the array substrate 100 dose not overlap with the reflective electrode 3.

In some examples, the array substrate 100 further includes peripheral circuit(s) (e.g., GOA circuit(s)) located in the frame region G, and the peripheral circuit(s) are fabricated synchronously with the gate lines GL, the data lines DL, and the thin film transistors 2 located in the display region F. Since the reflective electrodes 3 are only located in the display region F, and a thickness of the reflective electrodes 3 may be about 0.1 μm, by arranging the chamfer border 31c in the border 31 of the reflective electrode 3, and making the end surface E of the spacer 400 located in the display region F proximate to the array substrate 100 not overlap with the reflective electrode 3, it is possible to reduce a level difference between portions of the array substrate 100 abutting against different spacers 400, so that the amount of compression of the spacers 400 located in the display region F are equal to or substantially equal to the amount of compression of the spacers 400 located in the frame region G, which may avoid poor display such as frame mura in the display apparatus 1000.

The array substrate 100 included in the display apparatus 1000 has the same structure and the same beneficial effects as the array substrate 100 provided in the above embodiments. Since both the structure and the beneficial effects of the array substrate 100 have been described in detail in the above embodiments, details will not be repeated here.

In addition, the end surface E of the spacer 400 proximate to the array substrate 100 is arranged in the region surrounded by the chamfer borders 31c of the plurality of reflective electrodes 3 adjacent to the overlapping position, so that the spacer 400 may not overlap with the reflective electrode 3, which may effectively avoid the poor display such as the frame mura in the display apparatus 1000.

In some embodiments, as shown in FIG. 16, a spacing $L_7$ between the end surface E of the spacer 400 proximate to the array substrate 100 and each of the chamfer borders 31c of the plurality of reflective electrodes 3 adjacent to the spacer 400 is greater than or equal to 2.5 μm.

For example, the spacing between the end surface E of the spacer 400 proximate to the array substrate 100 and each of the chamfer borders 31c of the plurality of reflective electrodes 3 adjacent to the spacer 400 may be 2.5 μm, 2.7 μm, 2.8 μm, 3 μm, or 3.3 μm.

There is an aligning error in the process of assembling the array substrate 100 with the opposite substrate 200 to form the cell. By setting the spacing between the end surface E of the spacer 400 proximate to the array substrate 100 and each of the chamfer borders 31c of the plurality of reflective electrodes 3 adjacent to the spacer 400, it may be ensured that the end surface E of the spacer 400 proximate to the array substrate 100 can be located in the region surrounded by the chamfer borders 31c of the plurality of reflective electrodes 3 adjacent to the spacer 400 within the aligning error, so that an orthogonal projection of the end surface E of the spacer 400 proximate to the array substrate 100 on the second substrate 6 does not overlap with orthogonal projections of the plurality of reflective electrodes 3 adjacent to the spacer 400 on the second substrate 6. In this way, it is conducive to avoiding the poor display such as the frame mura in the display apparatus 1000.

In some embodiments, as shown in FIG. 14, the opposite substrate 200 may further include a black matrix 8 disposed on the side of the second substrate 6 proximate to the array substrate 100. In a case where the opposite substrate 200 includes the common electrode layer 7, the black matrix 8 may be located between the common electrode layer 7 and the second substrate 6.

In some examples, as shown in FIG. 17, the black matrix 8 has a plurality of openings K, and the plurality of openings are arranged in one-to-one correspondence with the plurality of sub-pixel regions P in the array substrate 100. As shown in FIG. 14, the opposite substrate 200 may further include a color filter layer 9 disposed on a side of the black matrix 8 proximate to the array substrate 100. The color filter layer 9 includes a plurality of color filter portions 91, and at least a portion of each color filter portion 91 is located in an opening K.

For example, the plurality of color filter portions 91 may include a plurality of red filter portions, a plurality of blue filter portions, or a plurality of green filter portions.

In some examples, as shown in FIG. 17, an orthogonal projection of an opening K on the first substrate 1 of the array substrate 100 is located within an orthogonal projection of a reflective electrode 3 on the first substrate 1. That is, the black matrix 8 covers the plurality of gate lines GL, the plurality of data lines DL, the plurality of thin film transistors 2 and the plurality of spacers 400 in the array substrate 100, and only exposes a portion of the reflective electrode 3 through the opening K. In this way, it is conducive to avoiding light leakage of the display apparatus 1000, so that the display apparatus 1000 can have a good display effect.

Here, the orthogonal projection of the spacer 400 on the first substrate 1 may be of various shapes, which may be selected according to actual needs.

For example, the orthogonal projection of the spacer 400 on the first substrate 1 may be in a shape of a circle or a polygon. The polygon may be, for example, a rectangle, a pentagon, a hexagon, or an octagon (as shown in FIG. 17).

It will be noted that a shape of an orthogonal projection of a portion of the black matrix 8 for shielding the plurality of spacers 400 (i.e., a portion of the black matrix 8 covering the overlapping position of the gate line GL and the data line DL) on the first substrate 1 is the same or substantially the same as the shape of the orthogonal projection of the spacer 400 on the first substrate 1, which may ensure a shielding effect of the black matrix 8 on the spacer 400.

For example, as shown in FIG. 17, in a case where the shape of the orthogonal projection of the spacer 400 on the first substrate 1 is the octagon, the shape of the orthogonal projection of the portion of the black matrix 8 for shielding the plurality of spacers 400 may be an octagon.

For example, a spacing between a portion of the opening K proximate to the overlapping position of the array substrate 100 and the chamfer border 31c of the reflective electrode 3 is less than or equal to 2.5 μm. That is, as shown in FIG. 17, a spacing $L_8$ between a border of each of the portions of the black matrix 8 for shielding the plurality of spacers 400 (i.e., the portion of the black matrix 8 covering the overlapping position of the gate line GL and the data line DL) and a chamfer border 31c of a corresponding reflective electrode 3c is less than or equal to 2.5 μm.

For example, the spacing $L_8$ may be 1.8 μm, 1.85 μm, 2 μm, 2.1 μm or 2.5 μm.

By setting the spacing between the portion of the opening K proximate to the overlapping position in the array substrate 100 and the chamfer border 31c of the reflective electrode 3, it may not only ensure the shielding effect of the black matrix 8 on the reflective electrode 3, but also ensure that the opening K has a large area, which makes the display apparatus 1000 have a large aperture rate. Furthermore, the spacing $L_8$ may be combined with the spacing $L_7$ between the end surface E of the spacer 400 proximate to the array substrate 100 and each of the chamfer borders 31c of the plurality of reflective electrodes 3 adjacent to the spacer 400, so as to define the position of the chamfer border 31c in the reflective electrode 3.

In some embodiments, the display apparatus 1000 may be any product or component having a display function, such as a mobile phone, a tablet computer, a television, a monitor, a laptop computer, a digital frame or a navigator, or may be a wearable electronic device such as a smart watch or a smart wristband.

Figure 11:
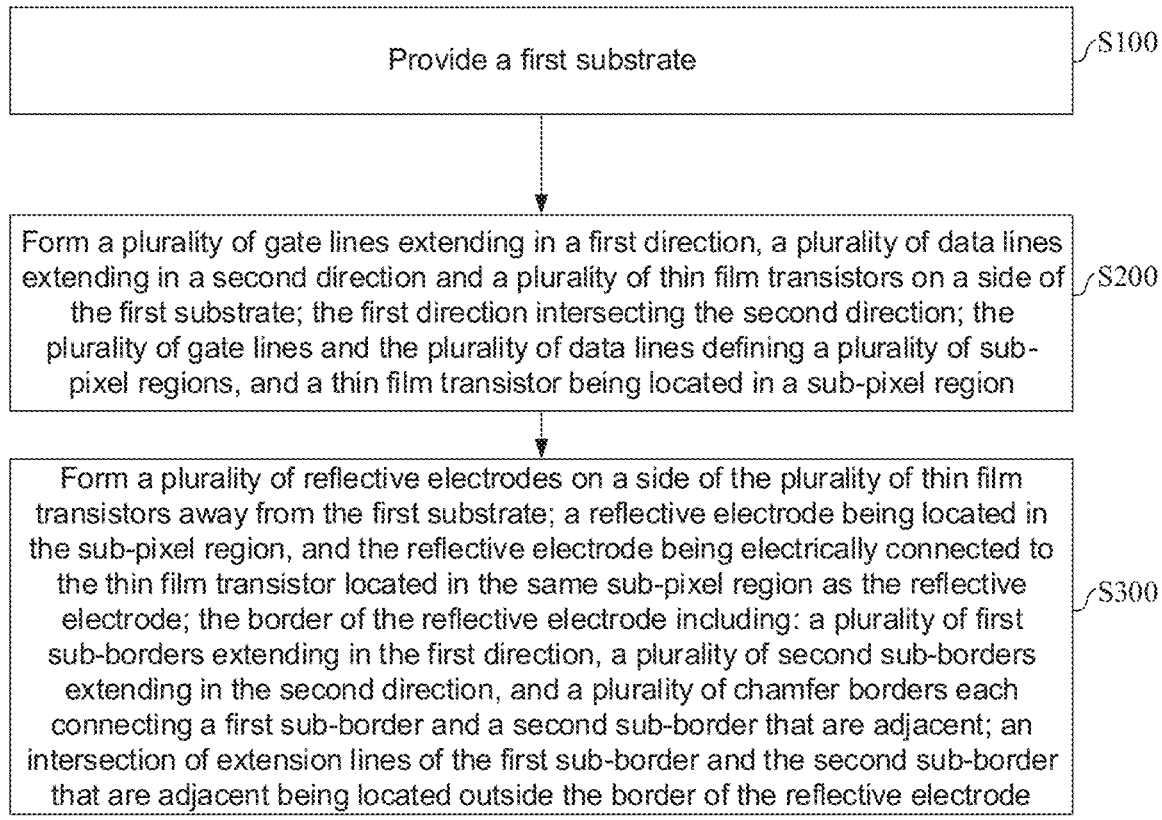
FIG. 11 is a flow diagram of a method for manufacturing an array substrate, in accordance with some embodiments of the present disclosure.

Some embodiments of the present disclosure provide a method for manufacturing an array substrate. As shown in FIG. 11, the method for manufacturing an array substrate includes S100 to S300.

In S100, a first substrate 1 is provided.

For example, for the structure of the first substrate 1, reference may be made to the schematic descriptions in some examples described above, which will not be repeated here.

In S200, a plurality of gate lines GL extending in a first direction X, a plurality of data lines DL extending in a second direction Y, and a plurality of thin film transistors 2 are formed on a side of the first substrate 1. The first direction X intersects the second direction Y. The plurality of gate lines GL and the plurality of data lines DL define a plurality of sub-pixel regions P, and a single thin film transistor 2 is located in a sub-pixel region P.

In some examples, considering an example where the thin film transistors 2 are all top-gate-type thin film transistors, forming the plurality of gate lines GL, the plurality of data lines DL and the plurality of thin film transistors 2 in S200 may include S210 to S250.

Figure 12A:
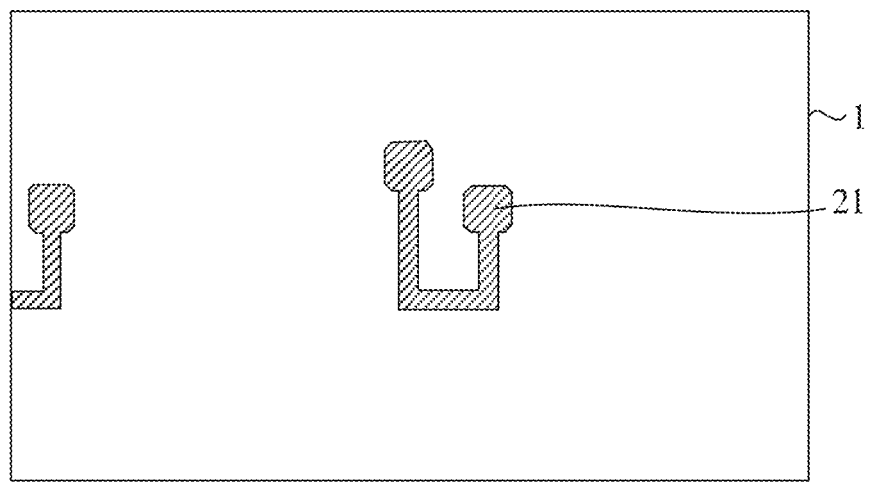
FIGS. 12(*a*) to 12(*d*) are diagrams showing a process of manufacturing an array substrate, in accordance with some embodiments of the present disclosure.
Figure 13A:
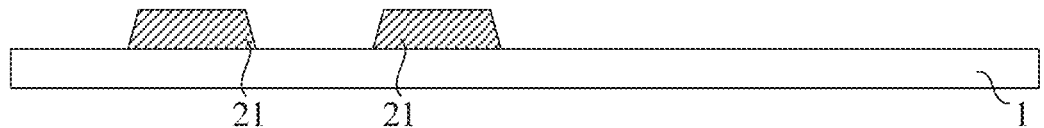
FIGS. 13(*a*) to 13(*g*) are diagrams showing a process of manufacturing another array substrate, in accordance with some embodiments of the present disclosure.

In S210, as shown in FIGS. 12(a) and 13(a), an active material film is formed on the side of the first substrate 1, and then the active material film is patterned to form a plurality of active layers 21.

For example, the active material film may be formed by using a deposition process. In a process of patterning the active material film, for example, a photolithography process may be used.

For example, the active layer 21 may be a U-shaped active layer.

Figure 13B:
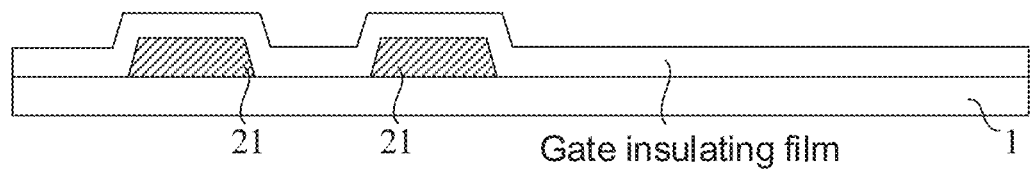

In S220, as shown in FIG. 13(b), a gate insulating film is formed on a side of the plurality of active layers 21 away from the first substrate 1.

For example, a material of the gate insulating film may be silicon oxide (SiOx), silicon nitride (SiNx), or silicon oxynitride (SiON).

For example, the gate insulating film may be formed by a chemical vapor deposition (CVD) process or a plasma enhanced chemical vapor deposition (PECVD) process.

Figure 12B:
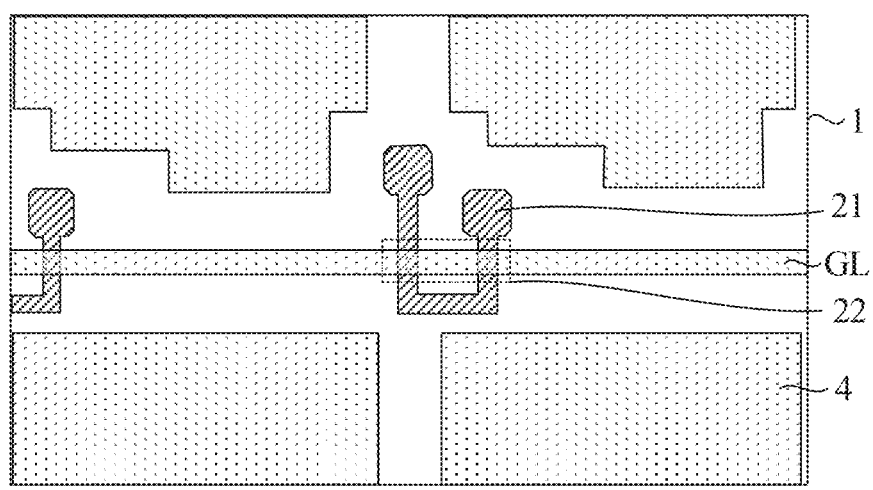
Figure 13C:
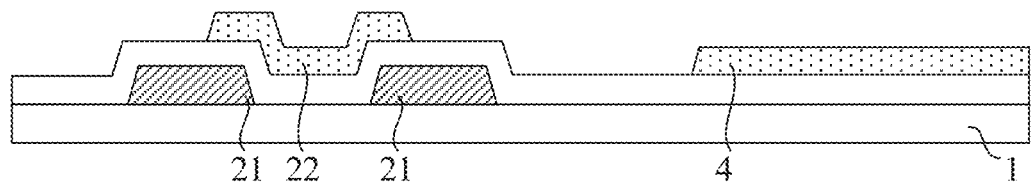

In S230, as shown in FIGS. 12(b) and 13(c), a gate conductive film is formed on a side of the gate insulating film away from the first substrate 1, and the gate conductive film is patterned to form the plurality of gate lines GL and a plurality of gates 22.

For example, the gate conductive film may be formed by using a deposition process, and then the gate conductive film is patterned by using a photolithography process.

For example, a gate line GL and multiple gates 22 may be formed integrally.

Optionally, a material of the gate conductive film may be a metal material such as silver (Ag), copper (Cu), aluminum (Al) or molybdenum (Mo).

Figure 13D:
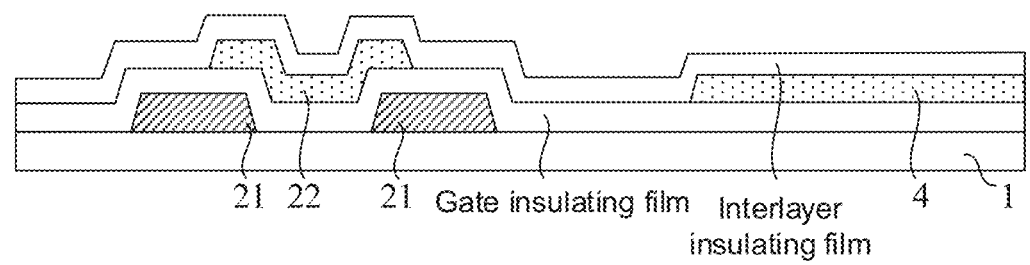
Figure 13E:
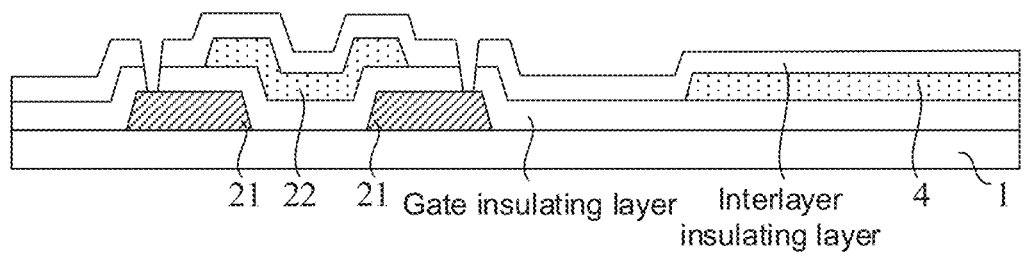

In S240, as shown in FIGS. 13(d) and 13(e), an interlayer insulating film is formed on a side of the plurality of gate lines GL and the plurality of gates 22 away from the first substrate 1, and the interlayer insulating film and the gate insulating film are patterned to form via holes exposing both ends of each active layer 21, so as to obtain an interlayer insulating layer and a gate insulating layer.

For example, the interlayer insulating film may be formed by using a deposition process, and then the interlayer insulating film and the gate insulating film are patterned by using a photolithography process.

Figure 12C:
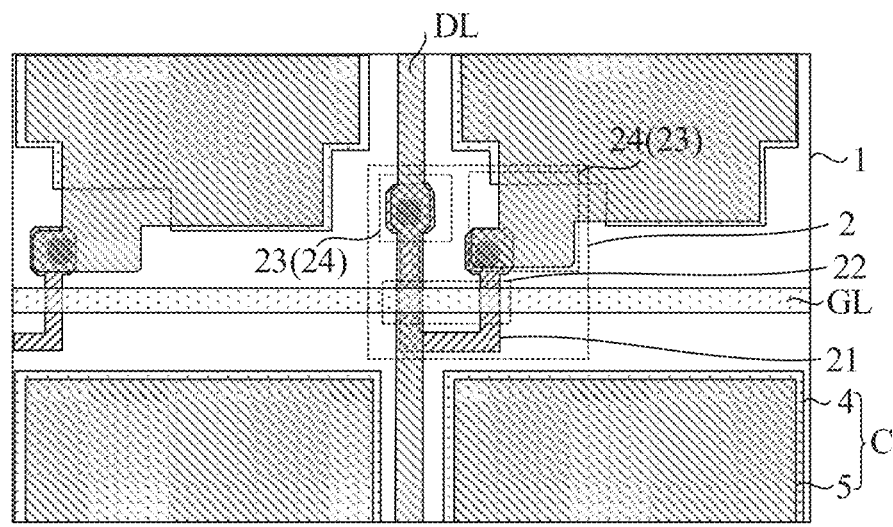
Figure 13F:
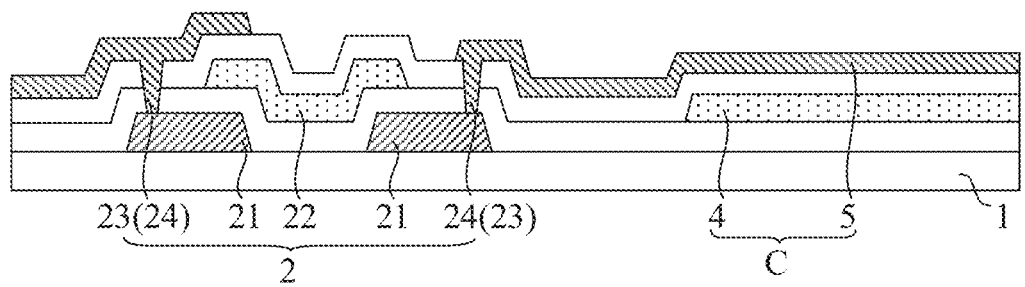

In S250, as shown in FIGS. 12(c) and 13(f), a source-drain conductive film is formed on a side of the interlayer insulating layer away from the first substrate 1, and the source-drain conductive film is patterned to form the plurality of data line DL, a plurality of sources 23 and a plurality of drains 24. The active layer 21 is electrically connected to the source 23 through a via hole, and electrically connected to the drain 24 through another via hole.

For example, the source-drain conductive film may be formed by using a deposition process, and then the source-drain conductive film is patterned by using a photolithography process.

For example, a material of the source-drain conductive film may be a metal material such as Ag, Cu, Al, or Mo. For example, in a case where Al is used as the material of the source-drain conductive film, the structure of the source-drain conductive film may be a laminated structure of ITO/A/ITO, so that ITO is used to protect Al, thereby preventing Al from being oxidized.

Figure 12D:
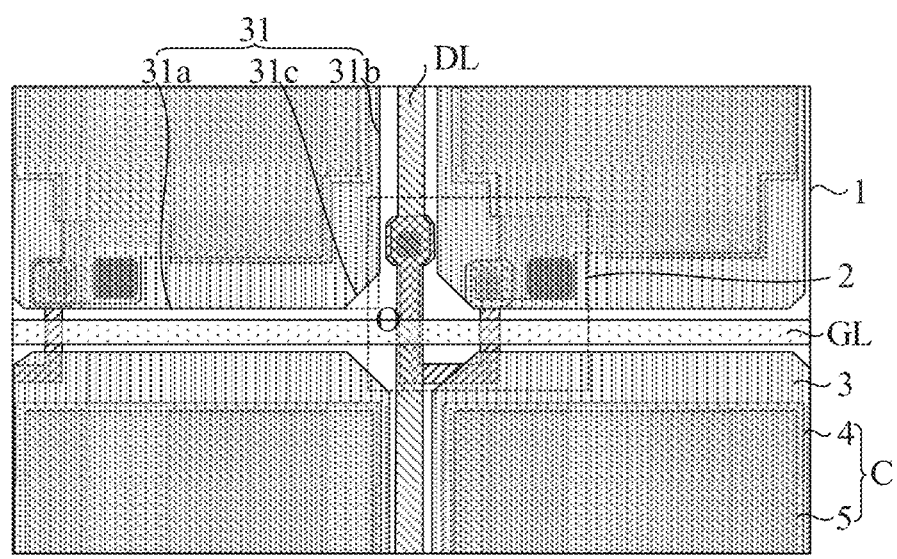
Figure 13G:
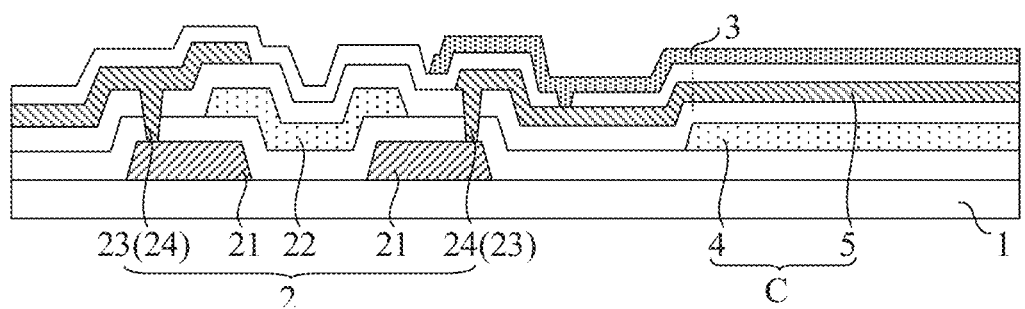

In S300, as shown in FIGS. 12(d) and 13(g), a plurality of reflective electrodes 3 are formed on a side of the plurality of thin film transistors 2 away from the first substrate 1. A single reflective electrode 3 is located in the sub-pixel region P, and the reflective electrode 3 is electrically connected to the thin film transistor 2 located in the same sub-pixel region P as the reflective electrode 3. The border 31 of the reflective electrode 3 includes a plurality of first sub-borders 31a extending in the first direction X, a plurality of second sub-borders 31b extending in the second direction Y, and a plurality of chamfer borders 31c each connecting a first sub-border 31a and a second sub-border 31b that are adjacent. An intersection O of extension lines of the first sub-border 31a and the second sub-border 31b that are adjacent is located outside the border 31 of the reflective electrode 3.

In some examples, forming the plurality of reflective electrodes 3 may include S310 and S320.

In S310, a reflective material film is formed on the side of the plurality of thin film transistors 2 away from the first substrate 1.

For example, the reflective material film may be formed by using a sputtering process or a deposition process.

In S320, the reflective material film is patterned to form the plurality of reflective electrodes 3.

For example, the reflective material film may be patterned through a photolithography process. Patterning the reflective material film through the photolithography process may include, for example, S321 to S324.

In S321, a photoresist layer is formed on a side of the reflective material film away from the first substrate 1.

For example, the photoresist layer may be formed by using a coating process.

In S322, the photoresist layer is exposed.

Here, considering an example where the photoresist used in the photoresist layer is a positive photoresist, when exposing the photoresist layer, a pattern of a portion of the photoresist layer that is not exposed is the same as a pattern of a reflective electrode to be formed, and a pattern of a portion of the photoresist layer that is exposed corresponds to the gate lines GL, the data lines DL and regions each surrounded by chamfer borders of adjacent reflective electrodes to be formed.

Due to the chamfer border, the spacing between the reflective electrode 3 and the overlapping position of the corresponding gate line GL and the corresponding data line DL increases. As a result, it may reduce a difference between photosensitive amounts of a portion of the photoresist layer corresponding to the overlapping position and photosensitive amounts of other portions.

In S323, the photoresist layer is developed to remove the exposed portion, so as to obtain a patterned photoresist layer.

Due to the chamfer border, the spacing between the reflective electrode 3 and the overlapping position of the corresponding gate line GL and the corresponding data line DL increases, thereby increasing the flowing space of the developing solution. In this way, in the process of developing the photoresist layer, the fluidity of the developing solution and the displacement effect between the developing solution and the photoresist layer may be effectively improved.

In S324, the reflective material film is patterned by using the patterned photoresist layer as a mask to obtain the plurality of reflective electrodes 3.

Due to the improvement of the fluidity of the developing solution and the improvement of the displacement effect between the developing solution and the photoresist layer, the exposed portion of the photoresist layer may be removed relatively completely. As a result, in the process of patterning the reflective material film, the patterned portion of the reflective material film may be removed relatively completely, so as to prevent materials of the reflective electrodes from being remained at the portion of the adjacent reflective electrodes 3 located in the overlapping position.

Beneficial effects that can be achieved by the method for manufacturing the array substrate provided by some embodiments of the present disclosure are the same as beneficial effects that can be achieved by the array substrate 100 provided in some embodiments described above, which will not be repeated here.

In some embodiments, the method for manufacturing the array substrate further includes: as shown in FIGS. 12(b) and 13(c), forming a plurality of first electrodes 4 synchronously in the process of patterning the gate conductive film to form the plurality of gate lines GL and the plurality of gates 22 in S230; and as shown in FIGS. 12(c) and 13(f), forming a plurality of second electrodes 5 synchronously in the process of patterning the source-drain conductive film to form the plurality of data lines DL, the plurality of sources 23 and the plurality of drains 24 in S250.

For example, a single first electrode 4 is located in a sub-pixel region P, and a single second electrode 5 is located in a sub-pixel region P. The first electrode 4 and the second electrode 5 that are located in the same sub-pixel region P constitute a storage capacitor C.

The first electrodes 4 and the gate lines GL are formed synchronously, and the second electrodes 5 and the data lines DL are formed synchronously. In this way, the process of manufacturing the array substrate 100 may be effectively simplified.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. An array substrate, comprising:
   a first substrate;
   a plurality of gate lines disposed on the first substrate and extending in a first direction, and a plurality of data lines disposed on the first substrate and extending in a second direction; the first direction intersecting the second direction, and the plurality of the gate lines and the plurality of data lines defining a plurality of sub-pixel regions;
   a plurality of thin film transistors disposed on the first substrate; a thin film transistor being located in a sub-pixel region; and
   a plurality of reflective electrodes disposed on a side of the plurality of thin film transistors away from the first substrate; a reflective electrode being located in the sub-pixel region, and the reflective electrode being electrically connected to the thin film transistor located in the same sub-pixel region as the reflective electrode, wherein
   each reflective electrode has a border including: a plurality of first sub-borders extending in the first direction, a plurality of second sub-borders extending in the second direction, and a plurality of chamfer borders each connecting a first sub-border and a second sub-border that are adjacent; an intersection of extension lines of the first sub-border and the second sub-border that are adjacent is located outside the border of the reflective electrode;
   the array substrate further includes:
   a plurality of first electrodes with a same material and disposed in a same layer as the plurality of gate lines, and a first electrode being located in the sub-pixel region; and
   a plurality of second electrodes with a same material and disposed in a same layer as the plurality of data lines, and a second electrode being located in the sub-pixel region, wherein
   the first electrode and the second electrode that are located in the same sub-pixel region constitute a storage capacitor;
   a minimum spacing between a border of an orthogonal projection of the second electrode on the first substrate and a border of an orthogonal projection of a data line adjacent to the second electrode on the first substrate is a first preset value;
   each thin film transistor includes a source and a drain;
   in a case where the second electrode is electrically connected to a source of the thin film transistor located in the same sub-pixel region as the second electrode, a spacing, in the first direction, between the border of the orthogonal projection of the second electrode on the first substrate and a border of an orthogonal projection of a drain of the thin film transistor located in the same sub-pixel region as the second electrode on the first substrate is a second preset value, and the second preset value is greater than or equal to the first preset value; and in a case where the second electrode is electrically connected to the drain of the thin film transistor located in the same sub-pixel region as the second electrode, a spacing, in the first direction, between the border of the orthogonal projection of the second electrode on the first substrate and a border of an orthogonal projection of the source of the thin film transistor located in the same sub-pixel region as the second electrode on the first substrate is a third preset value, and the third preset value is greater than or equal to the first preset value.

2. The array substrate according to claim 1, wherein shapes of a plurality of chamfer borders of a same reflective electrode are substantially same; and/or
lengths of the plurality of chamfer borders of the same reflective electrode are substantially equal.

3. The array substrate according to claim 2, wherein shapes of chamfer borders of different reflective electrodes are substantially same; and/or
lengths of the chamfer borders of the different reflective electrodes are substantially equal.

4. The array substrate according to claim 2, wherein
the shapes of the plurality of chamfer borders each include a straight-line shape; an included angle between a straight-line-shaped chamfer border and a first sub-border connected thereto is an obtuse angle, and an included angle between the straight-line-shaped chamfer border and a second sub-border connected thereto is an obtuse angle; or
the shapes of the plurality of chamfer borders each include a curved shape, and a center of curvature of a curved-shaped chamfer border is located within the border of the reflective electrode; or
the shapes of the plurality of chamfer borders each include a broken-line shape; a broken-line-shaped chamfer border includes at least two line segments sequentially connected, and an included angle between two adjacent line segments is an obtuse angle.

5. The array substrate according to claim 1, wherein an included angle between a connecting direction of two end points of one of at least two chamfer borders and the first direction is substantially equal to an included angle between a connecting direction of two end points of another of the at least two chamfer borders and the first direction.

6. The array substrate according to claim 5, wherein the first direction and the second direction are substantially perpendicular to each other;
an included angle between a connecting direction of two end points of each of the at least two chamfer borders and the first direction is 45°, and an included angle between the connecting direction of the two end points of each of the at least two chamfer borders and the second direction is 45°.

7. The array substrate according to claim 5, wherein the plurality of first sub-borders include two first sub-borders disposed oppositely;
the plurality of second sub-borders include two second sub-borders disposed oppositely; and
the plurality of chamfer borders include four chamfer borders, and a chamfer border is connected between a first sub-border and a second sub-border that are adjacent.

8. The array substrate according to claim 1, wherein in the same sub-pixel region, an orthogonal projection of a portion of the second electrode on the first substrate is located within an orthogonal projection of the first electrode on the first substrate.

9. The array substrate according to claim 8, wherein a minimum spacing between a border of the orthogonal projection of the second electrode on the first substrate and a border of the orthogonal projection of the first electrode on the first substrate is greater than or equal to 1 μm, and less than or equal to 10% of a spacing between two adjacent data lines.

10. The array substrate according to claim 8, wherein the first preset value is greater than or equal to 3 μm, and less than or equal to 40% of a spacing between two adjacent data lines.

11. The array substrate according to claim 1, wherein a minimum spacing between a border of an orthogonal projection of the first electrode on the first substrate and a border of an orthogonal projection of a data line adjacent to the first electrode on the first substrate is a fourth preset value;
in a case where the second electrode is electrically connected to a source of the thin film transistor located in the same sub-pixel region as the second electrode, a maximum spacing, in the first direction, between the border of the orthogonal projection of the first electrode located in the same sub-pixel region as the second electrode on the first substrate and a border of an orthogonal projection of a drain of the thin film transistor located in the same sub-pixel region as the second electrode on the first substrate is a fifth preset value, and the fifth preset value is greater than or equal to the fourth preset value; and
in a case where the second electrode is electrically connected to the drain of the thin film transistor located in the same sub-pixel region as the second electrode, a maximum spacing, in the first direction, between the border of the orthogonal projection of the first electrode located in the same sub-pixel region as the second electrode on the first substrate and a border of an orthogonal projection of the source of the thin film transistor located in the same sub-pixel region as the second electrode on the first substrate is a sixth preset value, and the sixth preset value is greater than or equal to the fourth preset value.

12. A display apparatus, comprising:
the array substrate according to claim 1;
an opposite substrate disposed opposite to the array substrate; and
a plurality of spacers disposed on a side of the opposite substrate proximate to the array substrate, wherein
an end surface of a spacer proximate to the array substrate corresponds to an overlapping position of a gate line and a data line in the array substrate, and is located in a region surrounded by chamfer borders of reflective electrodes adjacent to the overlapping position in the array substrate.

13. The display apparatus according to claim 12, wherein a spacing between the end surface of the spacer proximate to the array substrate and each of the chamfer borders of the reflective electrodes adjacent to the spacer is greater than or equal to 2.5 μm.

14. The display apparatus according to claim 12, wherein the opposite substrate includes:
a second substrate; and
a black matrix disposed on a side of the second substrate proximate to the array substrate, the black matrix having a plurality of openings, wherein an orthogonal projection of an opening on the first substrate in the array substrate is located within an orthogonal projection of a reflective electrode on the first substrate; and a spacing between a border of a portion of the black matrix covering the overlapping position in the array substrate and a chamfer border of the reflective electrode is less than or equal to 2.5 µm.

15. A method for manufacturing an array substrate, comprising:

providing a first substrate;

forming a plurality of gate lines extending in a first direction, a plurality of data lines extending in a second direction and a plurality of thin film transistors on a side of the first substrate; the first direction intersecting the second direction, the plurality of gate lines and the plurality of data lines defining a plurality of sub-pixel regions, and a thin film transistor being located in a sub-pixel region; and forming a plurality of reflective electrodes on a side of the plurality of thin film transistors away from the first substrate; a reflective electrode being located in the sub-pixel region, and the reflective electrode being electrically connected to the thin film transistor located in the same sub-pixel region, wherein each reflective electrode has a border including: a plurality of first sub-borders extending in the first direction, a plurality of second sub-borders extending in the second direction, and a plurality of chamfer borders each connecting a first sub-border and a second sub-border that are adjacent; an intersection of extension lines of the first sub-border and the second sub-border that are adjacent being located outside the border of the reflective electrode;

the method for manufacturing the array substrate further comprising:

forming a plurality of first electrodes synchronously in a process of forming the plurality of gate lines; a first electrode being located in the sub-pixel region; and forming a plurality of second electrodes synchronously in a process of forming the plurality of data lines; a second electrode being located in the sub-pixel region; the first electrode and the second electrode that are located in the same sub-pixel region constituting a storage capacitor; wherein a minimum spacing between a border of an orthogonal projection of the second electrode on the first substrate and a border of an orthogonal projection of a data line adjacent to the second electrode on the first substrate is a first preset value;

each thin film transistor includes a source and a drain;

in a case where the second electrode is electrically connected to a source of the thin film transistor located in the same sub-pixel region as the second electrode, a spacing, in the first direction, between the border of the orthogonal projection of the second electrode on the first substrate and a border of an orthogonal projection of a drain of the thin film transistor located in the same sub-pixel region as the second electrode on the first substrate is a second preset value, and the second preset value is greater than or equal to the first preset value; and in a case where the second electrode is electrically connected to the drain of the thin film transistor located in the same sub-pixel region as the second electrode, a spacing, in the first direction, between the border of the orthogonal projection of the second electrode on the first substrate and a border of an orthogonal projection of the source of the thin film transistor located in the same sub-pixel region as the second electrode on the first substrate is a third preset value, and the third preset value is greater than or equal to the first preset value.

* * * * *

UNITED STATES PATENT AND TRADEMARK OFFICE
CERTIFICATE OF CORRECTION

PATENT NO. : 12,216,365 B2
APPLICATION NO. : 17/797983
DATED : February 4, 2025
INVENTOR(S) : Jiguo Wang et al.

Page 1 of 1

It is certified that error appears in the above-identified patent and that said Letters Patent is hereby corrected as shown below:

In the Claims

In Column 26, Line 9, please change "claim 8" to --claim 1--

Signed and Sealed this
Twenty-ninth Day of July, 2025

Coke Morgan Stewart
*Acting Director of the United States Patent and Trademark Office*